(12) United States Patent  
Hotta et al.

(10) Patent No.: US 8,258,992 B2  
(45) Date of Patent: Sep. 4, 2012

(54) ANALOG-TO-DIGITAL CONVERTER

(75) Inventors: Masao Hotta, Tokorozawa (JP); Tatsuji Matsuura, Kanagawa (JP)

(73) Assignee: Semiconductor Technology Academic Research Center, Yokohama-shi, Kanagawa (JP)

( * ) Notice: Subject to any disclaimer, the term of this patent is extended or adjusted under 35 U.S.C. 154(b) by 39 days.

(21) Appl. No.: 12/907,629

(22) Filed: Oct. 19, 2010

(65) Prior Publication Data

US 2011/0090103 A1   Apr. 21, 2011

(30) Foreign Application Priority Data

Oct. 21, 2009   (JP) ................................ 2009-242597

(51) Int. Cl.  
*H03M 1/34* (2006.01)

(52) U.S. Cl. .................. 341/163; 341/155; 341/161

(58) Field of Classification Search .................. 341/155, 341/161, 163  
See application file for complete search history.

(56) References Cited

U.S. PATENT DOCUMENTS

| | | | | |
|---|---|---|---|---|
| 4,649,371 | A | * | 3/1987 | Kolluri ........................... 341/159 |
| 4,989,004 | A | * | 1/1991 | Kanayama .................... 341/161 |
| 6,163,291 | A | * | 12/2000 | Uchino et al. ................ 341/163 |
| 7,561,094 | B2 | | 7/2009 | Hotta et al. |

FOREIGN PATENT DOCUMENTS

JP   2008/124572   5/2008

OTHER PUBLICATIONS

Ogawa et al. "SAR ADC Algorithms with Redundancy." *The Inst. of Elec. Info. & Comm. Engineers*. 2007. pp. 1-6.

* cited by examiner

*Primary Examiner* — Khai M Nguyen  
(74) *Attorney, Agent, or Firm* — Merchant & Gould P.C.

(57) ABSTRACT

A sequential comparison-type analog-to-digital converter (ADC) that has improved precision and which is capable of high-speed operation is disclosed, the analog-to-digital converter comprising a digital-to-analog converter that outputs a plurality of different reference analog signals according to a multibit digital signal, a plurality of comparators that compare an input analog signal with the plurality of reference analog signals, and a sequential comparison control circuit that changes bit values of the multibit digital signal in order from higher bits so that at least one of the plurality of reference analog signals becomes closer to the input analog signal and decides the bit values in order from higher bits based on the comparison results and at the same time, correcting the decided higher bit values, wherein the sequential comparison control circuit decides the bit values of the multibit digital signal down to a predetermined bit based on the comparison results of the plurality of comparators and at the same time, correcting the bit values, and decides the bits lower than the predetermined bit based on the comparison result of one of the plurality of comparators.

4 Claims, 18 Drawing Sheets

| Ch | Cm | Cl | J | Eo | Eb |
|----|----|----|---|----|----|
| 0  | 0  | 0  | 0 | 1  | 1  |
| 0  | 0  | 1  | 0 | 0  | 1  |
| 0  | 1  | 0  | 1 | 1  | 0  |
| 0  | 1  | 1  | 1 | 0  | 1  |
| 1  | 0  | 0  | 0 | 1  | 0  |
| 1  | 0  | 1  | 0 | 1  | 0  |
| 1  | 1  | 0  | 1 | 1  | 0  |
| 1  | 1  | 1  | 1 | 1  | 1  |

ANALOG-TO-DIGITAL CONVERTER

CROSS REFERENCE TO RELATED APPLICATIONS

This application is based upon and claims the benefit of priority of the prior Japanese Patent Application No. 2009-242597, filed on Oct. 21, 2009, the entire contents of which are incorporated herein by reference.

BACKGROUND OF THE INVENTION

1. Technical Field of the Invention

The present invention relates to a sequential comparison-type analog-to-digital converter.

2. Related Art

As an analog-to-digital converter (ADC) mounted on a microcomputer or system LSI, a sequential comparison type is used in many cases from the viewpoint of downsizing and maintaining high precision.

FIG. 1 is a block diagram showing a configuration example of a conventional sequential comparison-type ADC. FIG. 2 is a diagram explaining a conversion operation in the sequential comparison-type ADC.

As shown in FIG. 1, the conventional sequential comparison-type ADC comprises a comparator 12, a sequential comparison control circuit 13, and a DA converter (digital-to-analog converter) 14. An input analog signal SA is held temporarily by, for example, a sample-holding circuit 11 and input to the comparator 12 as an input signal Vin.

It is assumed that the sequential comparison-type ADC has an n-bit (here, 8-bit) resolution and a full-scale voltage is VFS as shown in FIG. 2. In a first step, the sequential comparison control circuit 13 outputs a digital signal whose bit value of a first bit (b1) is "1" and whose bit values of second and subsequent bits (b2 to bn) are "0" and the DA converter 14 generates and outputs a reference analog signal Vref of a voltage corresponding to the digital signal. The voltage of the reference analog signal Vref in the first step is VFS/2. The comparator 12 compares the voltage of the input signal Vin with the voltage of the reference analog signal Vref and outputs a comparison result. The sequential comparison control circuit 13 decides the bit value of the first bit (b1) based on the comparison result. For example, when Vin is larger than Vref, b1 is decided to be "1" and when Vin is smaller than Vref, b1 is decided to be "0". In FIG. 2, b1 is "1". In the following explanation, "the comparator compares" means "the comparator compares voltages" and "the DA converter generates a reference analog signal corresponding to a digital signal" means "the DA converter generates a reference analog signal of a voltage corresponding to a digital signal".

In a second step, the sequential comparison control circuit 13 outputs a digital signal whose b1 is the value (here, "1") decided in the first step, whose bit value of the second bit (b2) is "1", and whose bit values of third and subsequent bits (b3 to bn) are "0" and the DA converter 14 generates and outputs the reference analog signal Vref corresponding to the digital signal. In the example in FIG. 2, the reference analog signal Vref in the second step is 3VFS/4. The comparator 12 compares the input signal Vin with the reference analog signal Vref and outputs a comparison result. The sequential comparison control circuit 13 decides the bit value of the second bit (b2) based on the comparison result. For example, when Vin is larger than Vref, b2 is decided to be "1" and when Vin is smaller than Vref, b2 is decided to be "0". In FIG. 2, b2 is "1".

Subsequently, the bit values of the third and subsequent bits are decided sequentially so that Vref becomes closer to Vin and when the bit value of the nth bit (the eighth bit) is decided, a state is brought about where Vref is closest to Vin, and therefore, the digital signal is output as an AD-converted value. When a voltage width corresponding to the least significant bit LSB of the AD-converted value to be decided is denoted by LSB, a difference of the AD-converted value to be decided to be Vin is within ±LSB/2. In the following explanation, in some cases, the voltage width corresponding to the least significant bit is denoted by LSB.

The algorithm to change the width, by which the above-mentioned reference analog signal Vref is changed, so that Vref becomes closer to Vin while reducing the width changed in the previous step to ½ is referred to as a binary conversion algorithm.

In recent years, an increase in operation speed is demanded also for the sequential comparison-type ADC. In the case of the sequential comparison-type ADC in FIG. 1, there is a possibility that determination will be erroneous unless the comparison by the comparator 12 is performed after the reference analog signal Vref output by the DA converter 14 has been sufficiently settled, and if the determination of the comparator 12 is erroneous once, it cannot be corrected and a large conversion error will result. Because of this, it is necessary to lengthen the time of each step so that the reference analog signal Vref output by the DA converter 14 is settled sufficiently in order to maintain precision, and therefore, it is difficult to increase the speed.

In order to meet the demand of both maintenance of precision and increase in speed, the applicants of the present application and the inventors of the invention of the present application have disclosed a sequential comparison-type ADC comprising three comparators in U.S. Pat. No. 7,561, 094 B2.

FIG. 3 is a block diagram showing the configuration of the sequential comparison-type ADC comprising three comparators described in U.S. Pat. No. 7,561,094 B2. FIG. 4 is a diagram explaining the conversion operation in the sequential comparison-type ADC in FIG. 3.

As shown in FIG. 3, the sequential comparison-type ADC described in U.S. Pat. No. 7,561,094 B2 comprises three comparators 12H, 12M, and 12L, a sequential comparison control circuit 13A, and a DA converter (digital-to-analog converter) 14A. The input analog signal SA is held temporarily in the sample-holding circuit 11 and input to the comparator 12 as the input signal Vin. The DA converter 14A outputs three different reference analog signals Vh, Vm, and Vl. The three comparators 12H, 12M, and 12L compare the input signal Vin with the reference analog signals Vh, Vm, and Vl, respectively. The comparison results are input to the sequential comparison control circuit 13A.

As shown in FIG. 4, it is assumed that the sequential comparison-type ADC in FIG. 3 has an n-bit (here, 8-bit) resolution and the full-scale voltage is VFS. In the first step, the sequential comparison control circuit 13A outputs a digital signal whose bit value of the first bit (b1) is "1" and whose bit values of the second and subsequent bits (b2 to bn) are "0". The DA converter 14A generates and outputs the reference analog signal Vm corresponding to the digital signal, the reference analog signal Vh of a voltage higher than Vm, and the reference analog signal Vl of a voltage lower than Vm. The difference between Vh and Vm and the difference between Vh and Vl correspond to the weight of the second bit, here, VFS/4, Vh=3VFS/4, and Vl=VFS/4.

The comparators 12H, 12M, and 12L compare the input signal Vin with the three reference analog signals Vh, Vm, and Vl, respectively, and outputs comparison results to the sequential comparison control circuit 13A. The sequential comparison control circuit 13A decides the bit values of the first bit (b1) and the second bit (b2) based on the three comparison results. For example, when Vin is larger than Vm and smaller than Vh, b1 is decided to be "1" and b2 "0".

In the second step, the sequential comparison control circuit 13A outputs a digital signal whose b1 and b2 are the values (here, "1" and "0") decided in the first step, whose bit value of the third bit (b3) is "1", and whose bit values of the fourth and subsequent bits (b4 to bn) are "0". The DA converter 14A generates and outputs the reference analog signal Vm=5VFS/8 corresponding to the digital signal, Vh=3VFS/4, and Vl=VFS/2. The comparators 12H, 12M, and 12L compare the input signal Vin with the three reference analog signals Vh, Vm, and Vl, respectively, and outputs comparison results to the sequential comparison control circuit 13A. The sequential comparison control circuit 13A decides the bit value of the third bit (b3) based on the three comparison results. For example, when Vin is smaller than Vm and larger than Vl, b3 is decided to be "0".

Subsequently, the bit values of the fourth and subsequent bits are decoded sequentially so that Vh, Vm, and Vl become closer to Vin while narrowing the difference between Vh and Vm and the difference between Vm and Vl and when the bit value of the nth bit (here, the eighth bit) is decided, an AD-converted value closest to Vin is decided. As described above, in the first step, the bit values of the first bit (b1) and the second bit (b2) are decided, and therefore, the total number of steps is seven.

As described above, in the sequential comparison-type ADC in FIG. 3, after the bits up to the pth bit are decided and when the (p+1)th bit is decided, Vm(p+1)=Vj(p)+V(p+1) is set. Here, Vj(p) is a DA-converted output for the decided bit number p from the higher bits and V(p+1) is a DA-converted output having a weight of the (p+1)th bit from the higher bits. Vh is Vm to which the weight of the (p+1)th bit is added and Vh(p+1)=Vm(p+1)+V(p+1) holds. Vl is Vm from which the weight of the (p+1)th bit is subtracted and Vh(p+1)=Vm(p+1)−V(p+1) holds. Comparison of the input signal with the three reference analog signals Vh, Vm, and Vl is performed. When the input signal Vin is determined to be between Vh, Vm, and Vl, the above-described procedure is repeated with p being replaced with p+1.

In the second and subsequent steps, if normal, the input signal Vin should be between Vh and Vm or between Vm and Vl. However, when noise overlaps the input signal Vin or the settlement of the DA converter is insufficient, it may happen that the input signal Vin is determined to be equal to or higher than Vh or equal to or lower than Vl. When the input signal Vin is determined to be equal to or higher than Vh, the sequential comparison control circuit 13A corrects the decided bit values so that Vh(p) is Vj(p) and generates a digital value so that the DA-converted value corresponding to Vh(p)(=Vj(p)) to which the DA-converted value of V(p+1) is added is Vm(p+1) and outputs the digital value to the DA converter 14. That is, Vm(p+1)=Vj(p)+V(p+1) holds. Similarly, when the input signal Vin is determined to be equal to or lower than Vl, the sequential comparison control circuit 13A corrects the decided bit values so that Vl(p) is Vj(p) and generates a digital value so that the DA-converted value corresponding to Vl(p) (=Vj(p)) from which the DA-converted value of V(p+1) is subtracted is Vm(p+1) and outputs the digital value to the DA converter 14. That is, Vh(p+1)=Vm(p+1)−V(p+1) holds. In this manner, it is possible to correct the value of the higher bit once decided in a subsequent step, and therefore, even in the state where noise overlaps the input signal Vin or when an error occurs by performing AD conversion in the state where the settlement of the DA converter is insufficient, it is possible to correct the error later.

FIG. 5 is a diagram explaining error correction in the sequential comparison-type ADC. What is a problem is a relationship between the input signal Vin and the reference analog signals Vh, Vm, and Vl and the case where the reference analog signals Vh, Vm, and Vl change is also a problem. For the sake of simplification of explanation, an example is explained, in which the three reference analog signals Vh, Vm, Vl output from the DA converter 14A are correct and the voltage of the input signal Vin is not settled during the first three steps but increases gradually.

As shown in FIG. 5, in the first step, the input signal Vin is increasing and determined to be between Vm(=VFS/2) and Vl(=VFS/4). The sequential comparison control circuit 13A decides b1=0 and b2=1 based on the comparison result and as a digital value in the second step, outputs a digital signal whose b1=0, b2=1, b3=1, and b4 to bn=0. The DA converter 14 generates and outputs the reference analog signal Vm=3VFS/8 corresponding to the digital signal, Vh=VFS/2, and Vl=VFS/4. In the second step, the input signal Vin further increases and Vin is determined to be larger than Vh(=VFS/2). The comparison result does not agree with the decided b1=0 and b2=1, and therefore, the sequential comparison control circuit 13A corrects them to b1=1 and b2=0 and further decides b3=0 and as a digital value in the second step, outputs a digital signal whose b1=1, b2=0, b3=0, b4=1, and b5 to bn=0. The DA converter 14A generates and outputs the reference analog signal Vm=9VFS/16 corresponding to the digital signal, Vh=5VFS/8, and Vl=VFS/2. In the third step, the input signal Vin ceases increasing and is settled and determined to be between Vh(=5VFS/8) and Vm(=9VFS/16). This comparison result agrees with the decided bit values, and therefore, b4=1 is decided. Similarly as above, the bits up to b8 are decided.

The sequential comparison-type analog-to-digital converter comprising three comparators described in U.S. Pat. No. 7,561,094 B2 is explained as above. However, the number of comparators is not limited to three and two or four or more comparators may be comprised and depending on the number of comparators, the magnitude of an error that can be corrected in each step differs.

In the sequential comparison-type ADC described in U.S. Pat. No. 7,561,094 B2 explained above, a set value of the DA converter in a certain comparison step is regarded as the reference analog signal Vm at the center and to this or from this, a weight of a bit to be determined in the next step is added or subtracted and thus the reference analog signals Vh and Vl are set. It is possible to know whether an error occurs in the determination depending on which range the input signal is located with respect to the three reference analog signals. When the input signal is out of the range of Vh and Vl, it is determined that the determination in the previous step is erroneous and the higher bits decided before the step are corrected and Vh, Vm, and Vl are also corrected in accordance with the correct range. Subsequently, by repeating this processing sequentially to the least significant bit, it is possible to make a determination with sufficient redundancy for the higher bits and it is also made possible to correct the erroneous conversion. The redundancy of a sequential comparison-type ADC is described in, for example, "SAR ADC Algorithms with Redundancy" by Tomohiko OGAWA, Haruo KOBAYASHI, Yosuke TAKAHASHI, and Masao HOTTA, THE INSTITUTE OF ELECTRONICS, INFORMATION AND COMMUNICATION ENGINEERS, Circuit and System Research Group, Tokyo (October 2007).

SUMMARY OF THE INVENTION

As described above, the interval between voltage levels of the three reference analog signals Vh, Vm, Vl becomes smaller as the determination step proceeds. In order to correct a determination error (conversion error) that has occurred in the previous step in a subsequent step, it is necessary to maintain a relationship of Vh>Vm>Vl without exception.

The causes of the occurrence of the relative offset of comparators are independent of each other, and therefore, in order to reduce the relative offset, it is necessary to reduce the offset itself of each comparator. However, when the precision of the sequential comparison-type ADC is improved, i.e., the number of bits increases, it is difficult to meet the demand to suppress the offset of the comparator to ±LSB/2 or less. In consideration of variations in semiconductor process, in order to suppress the variations in offset of a comparator to ±1 mV or less, i.e., ±LSB/2 or less, a circuit design that absorbs the variations in offset is required and there arises such a problem that the power consumption and chip size are increased.

An object of the present invention is to realize a sequential comparison-type ADC that meets both high-speed and precision.

According to the present invention, a sequential comparison-type analog-to-digital converter of the present invention includes: a digital-to-analog converter that outputs a plurality of reference analog signals different from one another according to a multibit digital signal; a plurality of comparators that compare an input analog signal with the plurality of reference analog signals; and a sequential comparison control circuit that changes the bit values of the multibit digital signal in order from higher bits so that at least one of the plurality of reference analog signals becomes closer to the input analog signal and decides the bit values of the multibit digital signal in order from higher bits based on the comparison results of the plurality of comparators in accordance with the plurality of reference analog signals having been changed and at the same time, correcting the decided bit values of higher bits, wherein the sequential comparison control circuit decides the bit values of the multibit digital signal based on the comparison results of the plurality of comparators down to the predetermined bit and at the same time, correcting the bit vales, and decides the bits lower than the predetermined bit based on the comparison result of one of the plurality of comparators.

BRIEF DESCRIPTION OF THE DRAWINGS

The features and advantages of the invention will be more clearly understood from the following description taken in conjunction with accompanying drawings, in which.

DESCRIPTION OF THE PREFERRED EMBODIMENTS

Before the embodiments are explained, the problems of the related art are explained with reference to the drawings.

As described above, the interval between voltage levels of the three reference analog signals Vh, Vm, Vl becomes smaller as the determination step advances. In order to correct a determination error (conversion error) that has occurred in the previous step in a subsequent step, it is necessary to maintain the relationship of Vh>Vm>Vl without exception.

Figure 6:
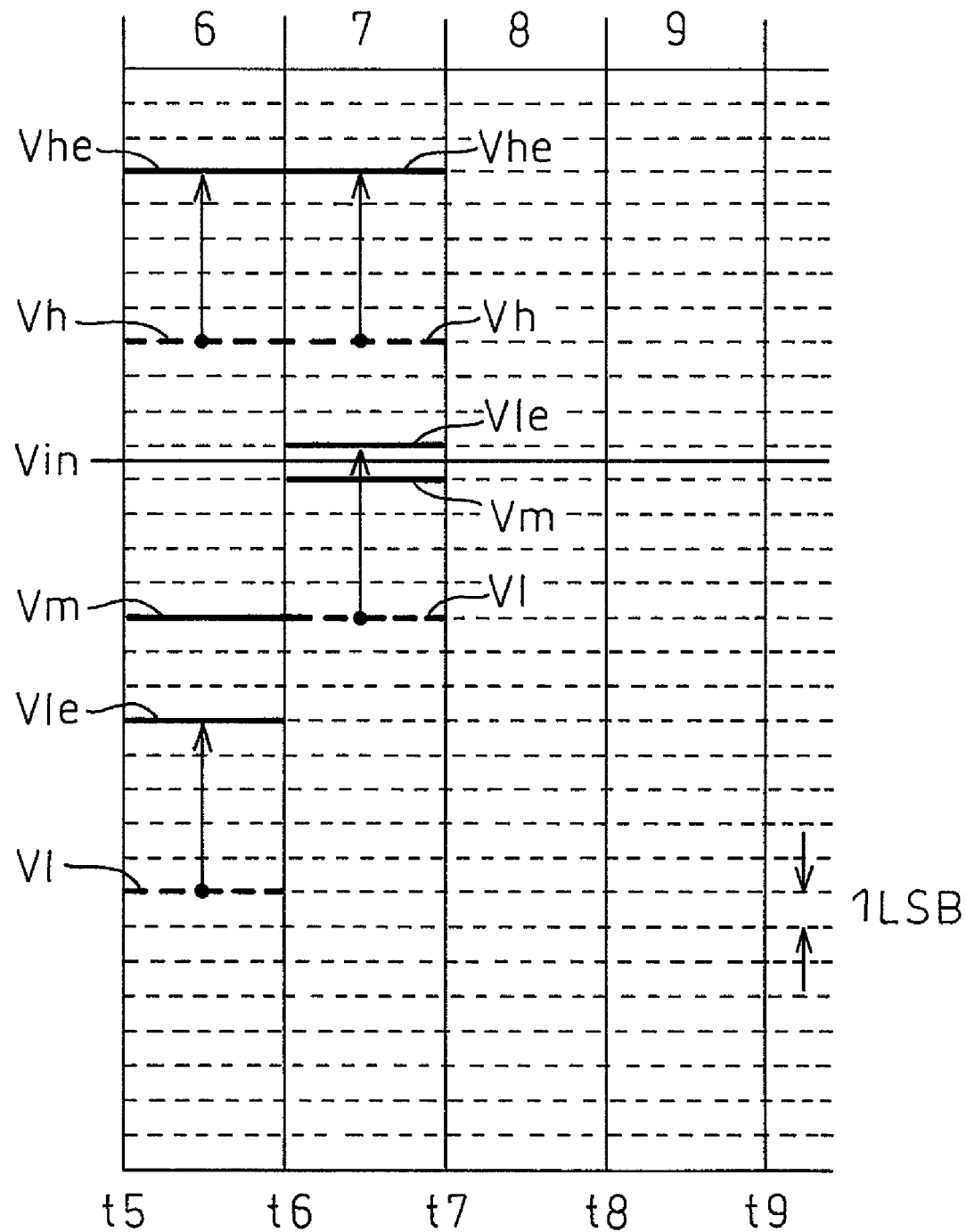
FIG. 6 is a diagram explaining a problem when there is a relative offset of the three comparators.

FIG. 6 is a diagram explaining a problem when the three comparators have a relative offset, that is, for the offset of the comparator 12M, the other two comparators 12H and 12L have a relative offset. In FIG. 6, Vh, Vm, and Vl denote reference analog signals when there is no offset, and Vhe and Vle denote relative reference analog signals when the comparators 12H and 12L have an offset. The comparators 12H and 12L make a comparison based on the relative reference analog signals Vhe and Vle as a result. In FIG. 6, no problem arises in the sixth step; however, Vm<Vl in the seventh step, and therefore, it is not possible to determine whether or not a determination error has occurred in the sixth step by the comparison result in the seventh step, and therefore, the determination will be erroneous as a result. Consequently, it is necessary to relatively suppress the offset of the three comparators to ±LSB/2 or less in order to maintain the relationship until the least significant bit is decided to avoid an erroneous determination. The offset of the comparator 12M will be the offset of the AD-converted value; however, this is unlikely to affect the linearity of the AD-converted value. However, the offset of the comparators 12H and 12L relative to the comparator 12M will be a conversion error, and therefore, will cause the linear error.

The causes of the occurrence of the relative offset of comparators are independent of each other, and therefore, in order to reduce the relative offset, it is necessary to reduce the offset itself of each comparator. However, when the precision of the sequential comparison-type ADC is improved, i.e., the number of bits increase, it is difficult to meet the demand to suppress the offset of the comparator to ±LSB/2 or less. In consideration of variations in semiconductor process, in order to suppress the variations in the offset of a comparator to ±1 mV or less, i.e., ±LSB/2 or less, a circuit design that absorbs the variations in offset is required and there arises such a problem that the power consumption and chip size are increased.

In the sequential comparison-type analog-to-digital converter of the present invention, the values of higher bits down to a predetermined bit are decided in order from higher bits while being corrected based the comparison results of a plurality of comparators and the values of bits lower than the predetermined bit are decided based on the comparison result of one of the plurality of comparators.

According to the present invention, the bits lower than a predetermined bit are decided based on the comparison result of one of a plurality of comparators, and therefore, it is possible to decide an AD-converted value with high precision without being affected by a relative offset among the plurality of comparators. As described above, when the time period of each step is shortened to increase speed, the output of the DA converter is not settled sufficiently, and therefore, a correction is made using a plurality of comparators. As steps advance and the change in amplitude of the output voltage of the DA converter becomes small, the time period until the output of the DA converter is settled will become shorter. Because of this, in the step for deciding values of lower bits, an error resulting from the settlement of the output of the DA converter will become small. According to the present invention, the higher bits, which require a long time period until the output of the DA converter is settled, are decided while being corrected by comparing an input signal with a plurality of reference analog signals using a plurality of comparators, and thus, the error resulting from the settlement of the output of the DA converter is reduced and high precision is maintained. On the other hand, the lower bits, which require a short time period until the output of the DA converter is settled, are decided based on the comparison result of one of the plurality of comparators, and thereby, the influence of a relative offset among the plurality of comparators is eliminated and high precision is maintained. Further, when deciding the lower bits, the time period until the output of the DA converter is settled is short, and therefore, it is not necessary to take into consideration the error resulting from the settlement of the output of the DA converter and it is possible to maintain high precision by the comparison result of only one comparator.

As described above, the offset of one comparator is the offset of the AD-converted value; however, this offset is unlikely to affect the linearity of the AD-converted value. Because of this, the use of one comparator does not bring any problem of the linearity; however, the values of the higher bits decided before the switching are corrected by the comparison results of the plurality of comparators, and therefore, the linearity before and after the switching is not guaranteed. Because of this, it is desirable to guarantee the linearity before and after switching when the use of the plurality of comparators is switched to the use of one comparator.

For example, in a 10-bit sequential comparison-type ADC, it is assumed that the first to seventh bits are decided while being corrected using the comparison results of a plurality of comparators (three comparators) and the remaining bits, i.e., the eighth to tenth bits are decided using the comparison result of one comparator. The first two bits are decided in the first step, and therefore, the number of steps required to decide the first to seventh bits is six. When deciding the eighth to tenth bits, if switching is only performed so as to utilize the output of a comparator that makes a comparison with the intermediate reference analog signal Vm, the values of the eighth to tenth bits are decided in three steps, i.e., the seventh to ninth steps. In this case, if no correction is made, in the sixth step for deciding the value of the seventh bit, Vh−Vm=Vm−Vl=8LSB, and Vm in the seventh step for deciding the value of the eighth bit increases or decreases by 4LSB from Vm in the sixth step. Here, Vh is a higher one among the three reference analog signals and Vl is lower among the three reference analog signals.

When the linearity before and after switching is not guaranteed, there is a possibility that Vm and the input signal are apart more than 8LSB in the seventh step, and in this case, if Vm is changed only by 2LSB in the eighth step, there may occur a case where the difference between Vm and the input signal is not 1LSB or less in the ninth step, and therefore, the precision cannot be guaranteed.

Because of this, in the present invention, after the step immediately after the switching is performed so that only the comparison result of one comparator is used, the weight of the bit to change Vm in the next step is increased to guarantee the linearity at the time of switching. For example, when Vh−Vm=Vm−Vl=8LSB in the sixth step as described above, Vm in the seventh step is caused to change to Vm in the eight step by 8LSB. In this case, if the number of steps is nine, the number of steps will be insufficient to reduce the difference between Vm and the input signal to 1LSB or less, and therefore, the number of steps is increased. Further, there may be a case where the values of the higher bits are changed, which have been corrected and decided by the comparison results of the plurality of comparators before the switching. Deciding a bit value is supposed to include deciding it temporarily.

Consequently, in order to guarantee the linearity at the time of switching as described above, it is desirable to cause k>n−m to hold in the sequential comparison control circuit, where the number of bits of the analog-to-digital converter is n, the number of higher bits down to a predetermined bit to be decided based on the comparison results of the plurality of comparators is m, and the number of steps for deciding bit values based on the comparison result of one of the plurality of comparators is k.

When an ADC is used, what is important is that an AD-converted value is output in a predetermined clock cycle. In the sequential comparison-type ADC described in U.S. Pat. No. 7,561,094 B2, it can be thought that switching is performed so that only the comparison result of one ADC is used when the error is judged to be large; however, the timing at which the AD-converted value is output is not fixed, and therefore, there is a problem in practical use. According to the present invention, the number of steps is somewhat increased and the speed is somewhat reduced, however, it is possible to obtain an AD-converted value with high precision while maintaining a sufficiently high speed.

As described above, when increasing the number of steps for deciding the lower bits, it is also possible to apply the non-binary conversion algorithm described in the above-described "SAR ADC Algorithms with Redundancy" by Tomohiko OGAWA, Haruo KOBAYASHI, Yosuke TAKAHASHI, and Masao HOTTA, THE INSTITUTE OF ELECTRONICS, INFORMATION AND COMMUNICATION ENGINEERS, Circuit and System Research Group, Tokyo (October 2007). In this case, it is possible to correct an error to a certain level also when deciding the lower bits.

Figure 1:
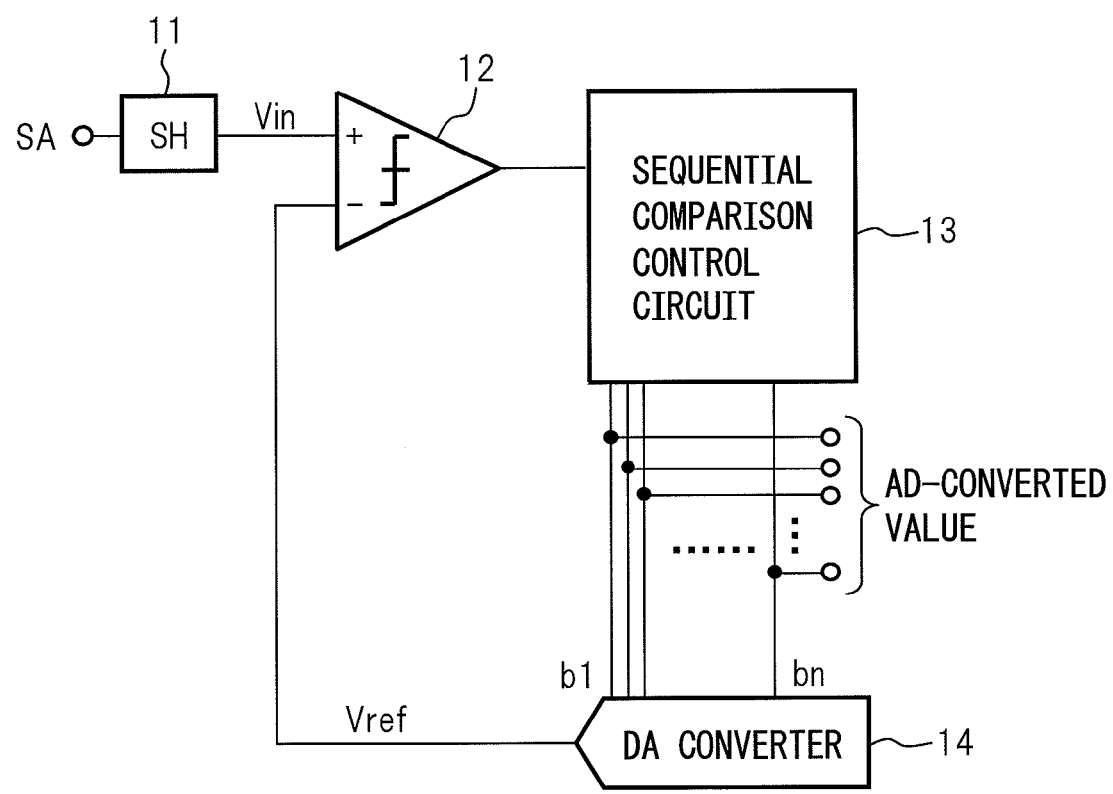
FIG. 1 is a block diagram showing a configuration example of a conventional sequential comparison-type ADC.
Figure 2:
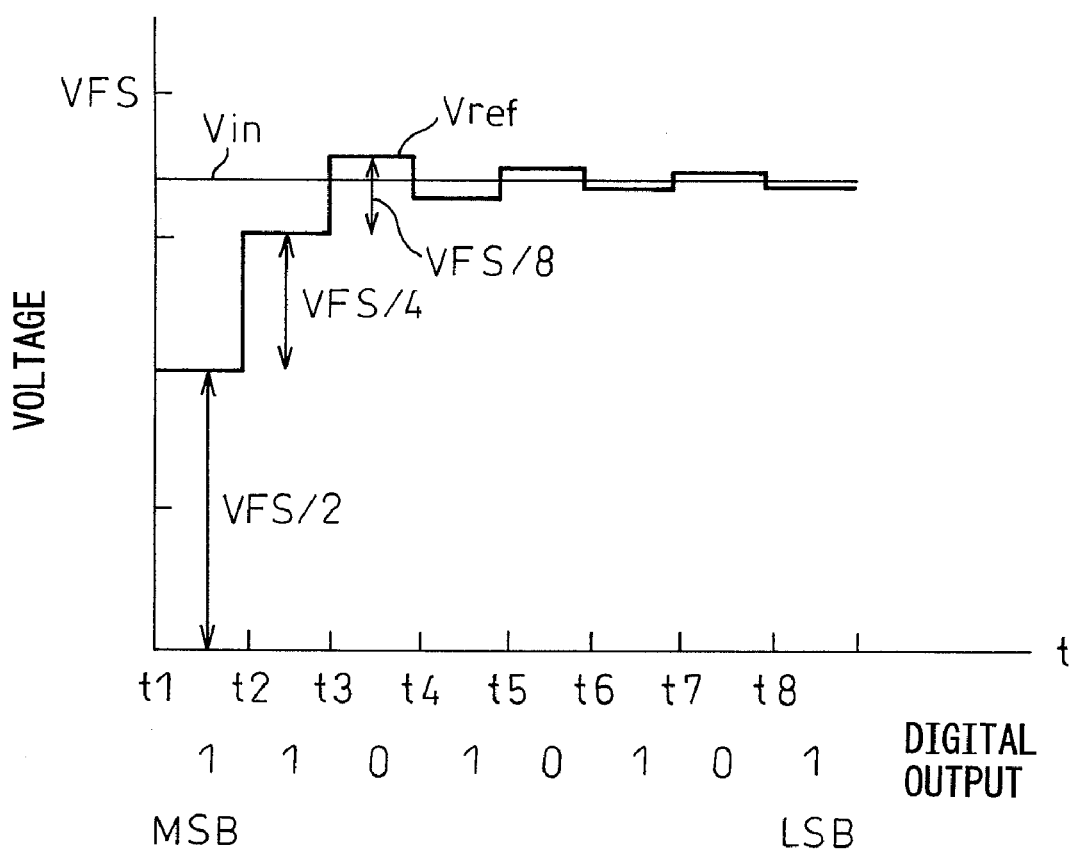
FIG. 2 is a diagram explaining a conversion operation in a sequential comparison-type ADC.
Figure 3:
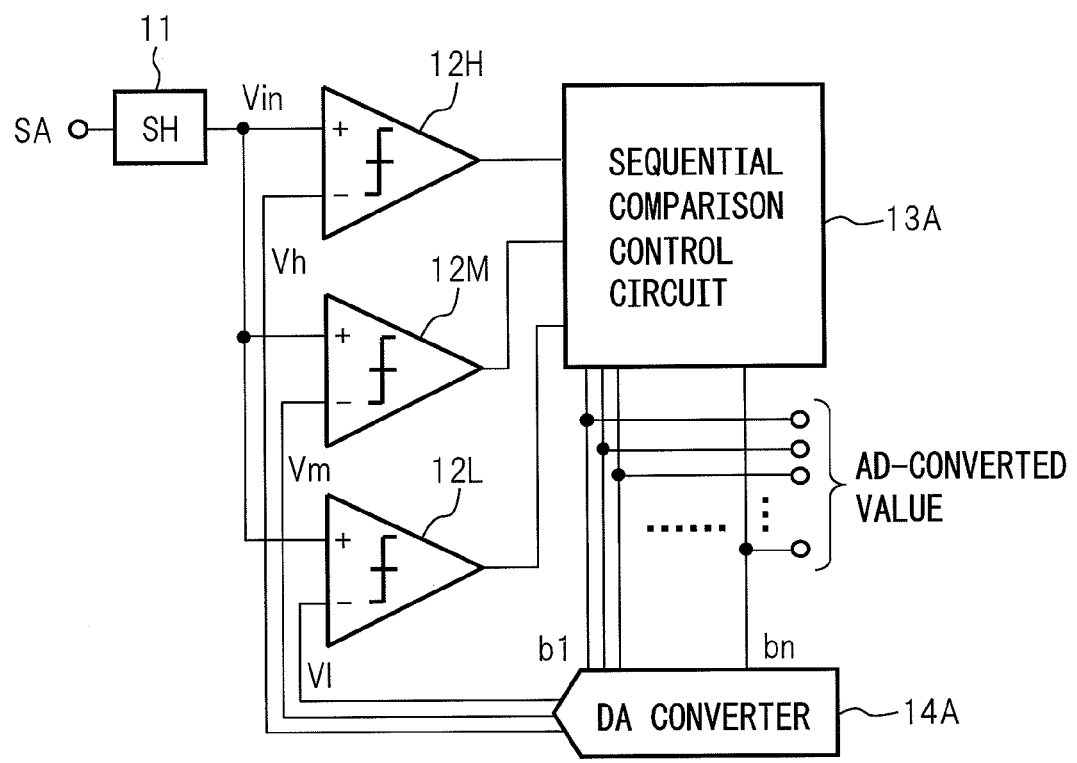
FIG. 3 is a block diagram showing a configuration of a sequential comparison-type ADC comprising three comparators.
Figure 4:
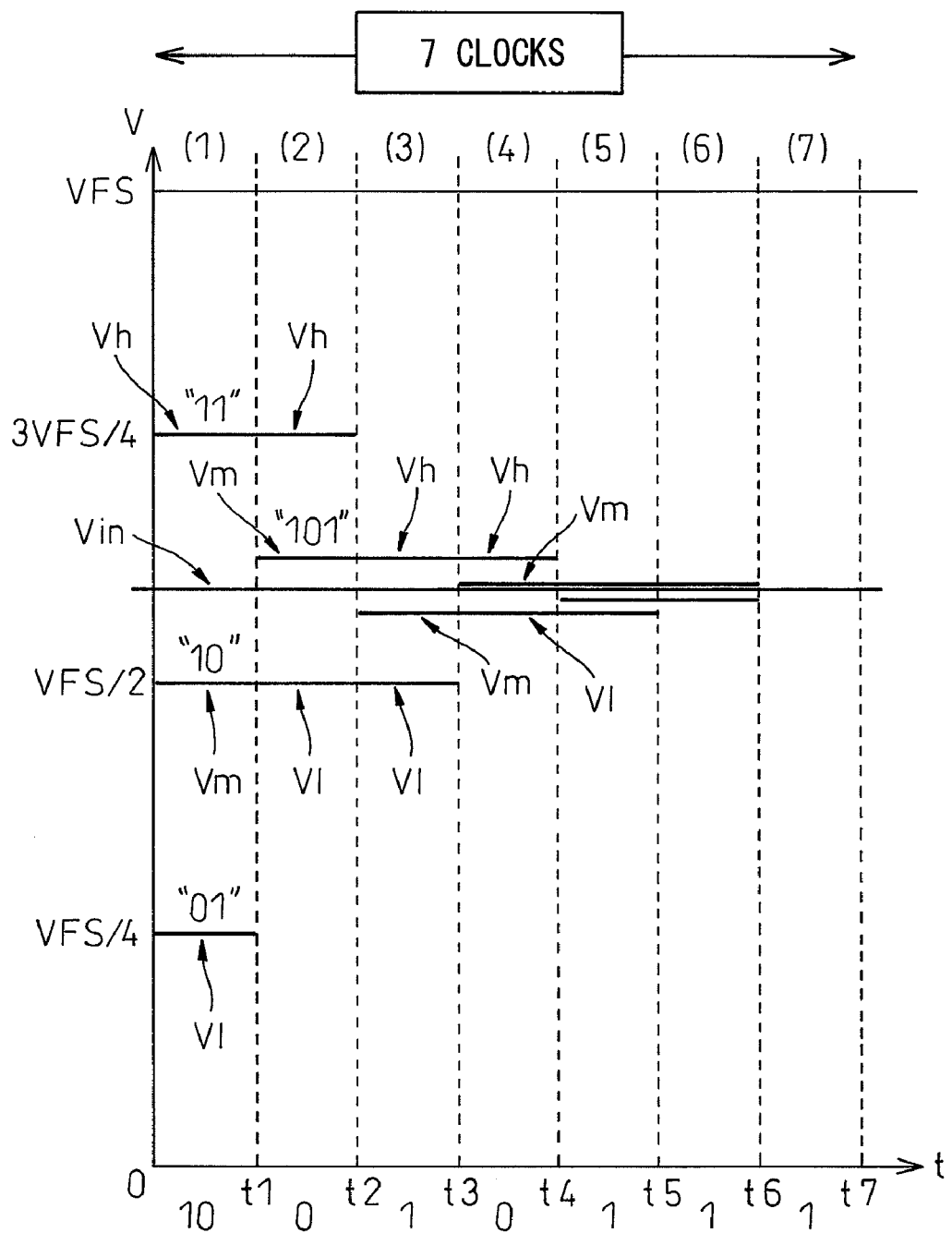
FIG. 4 is a diagram explaining a conversion operation in the sequential comparison-type ADC in FIG. 3.
Figure 5:
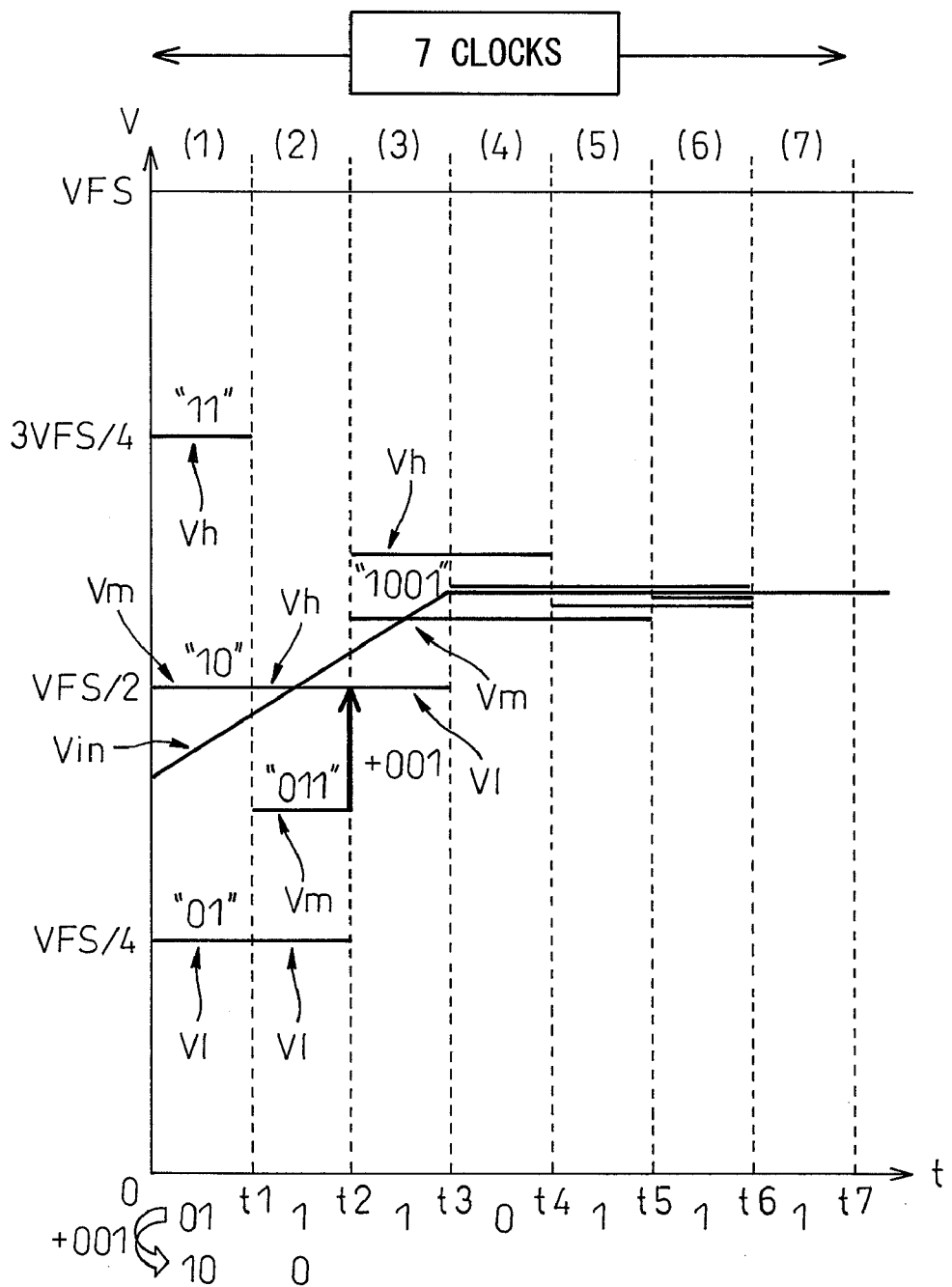
FIG. 5 is a diagram explaining error correction in the sequential comparison-type ADC in FIG. 3.
Figure 7:
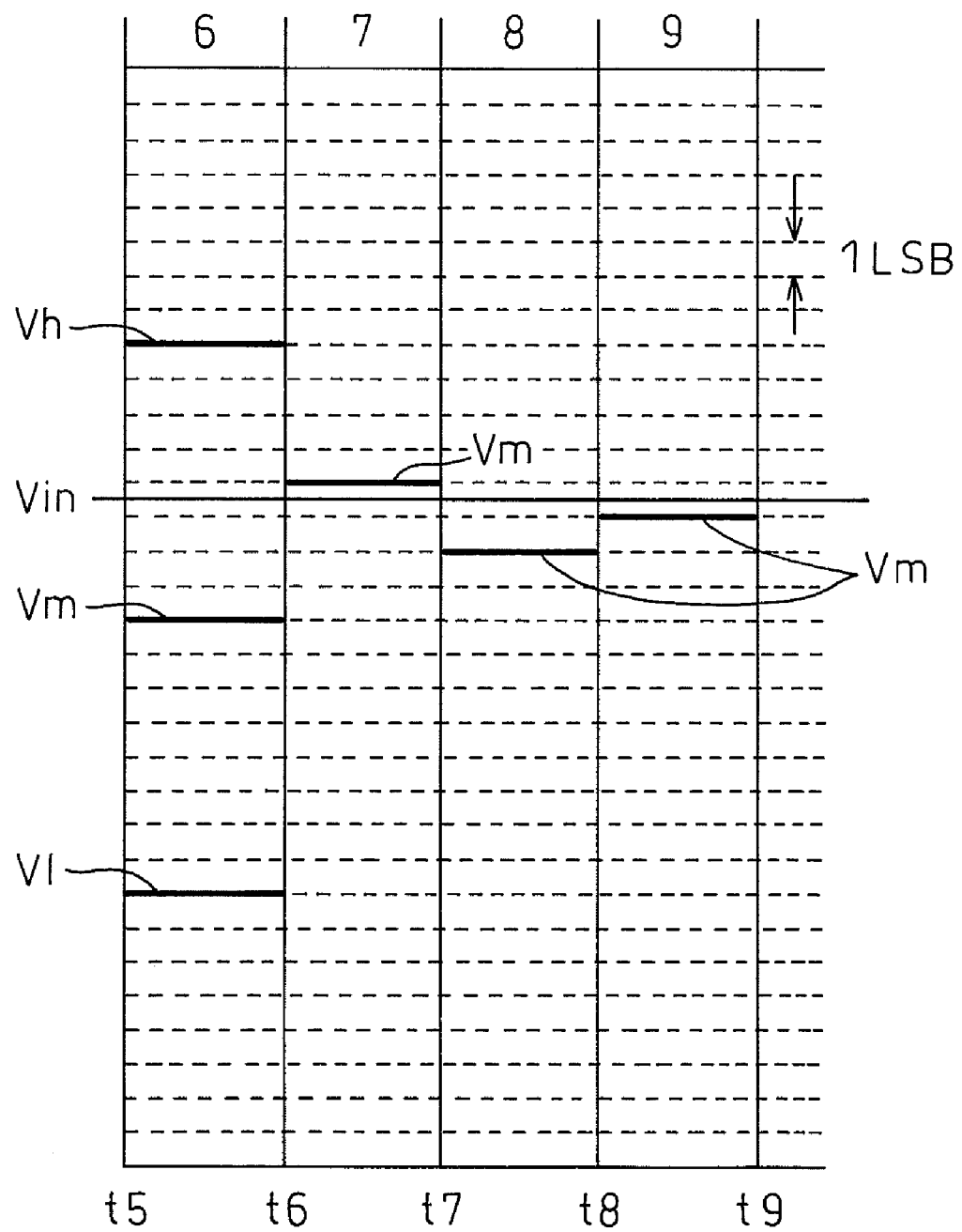
FIG. 7 is a diagram explaining an operation in an ADC in a first embodiment of the present invention.

FIG. 7 is a diagram explaining the operation in the sequential comparison-type analog-to-digital converter (ADC) in the first embodiment of the present invention. The sequential comparison-type ADC in the first embodiment comprises the same configuration as that of the sequential comparison-type ADC shown in FIG. 3 and differs from the latter only in the processing operation in a sequential comparison control circuit 13A.

The sequential comparison-type ADC in the first embodiment is a 10-bit ADC and the higher bits 1 to 7 are decided while being corrected based on the comparison results between the input signal Vin and the three reference analog signals Vh, Vm, and Vl by the three comparators 12H, 12M, and 12L and the lower eighth to tenth bits are decided based on the comparison result between the input signal Vin and the reference analog signal Vm by one comparator 12M. The first two bits are decided at the same time in the first step, and therefore, all the bits are decided in nine steps, i.e., the higher bits 1 to 7 are decided in steps 1 to 6 and the lower eighth to tenth bits are decided in steps 7 to 9.

As shown in FIG. 7, in step 6, the three comparators 12H, 12M, 12L compare the input signal Vin with the three reference analog signals Vh, Vm, and Vl and decide bit 7 based on the comparison result. In step 7, based on the result in step 6, the reference analog signal Vm is changed by the weight of bit 8. In the example shown in FIG. 7, in step 6, the input signal Vin is determined to be between Vh and Vm, and therefore, Vm is increased by 4LSB. If the input signal Vin is determined to be between Vm and Vl in step 6, Vm is decreased by 4LSB. Then, in step 7, the comparator 12M compares the input signal Vin with the reference analog signal Vm and decides bit 8 based on the comparison result. Subsequently, in step 8, Vm is increased or decreased by 2LSB based on the comparison result in step 7 and bit 9 is decided based on the comparison result between Vin and Vm by the comparator 12M and in step 9, Vm is increased or decreased by 1LSB based on the comparison result in step 8 and bit 10 is decided based on the comparison result between Vin and Vm by the comparator 12M.

In the sequential comparison-type analog-to-digital ADC in the first embodiment, switching is performed so that the comparison result of one comparator is utilized in the state where the change in amplitude of the reference analog signal output from the DA converter is reduced, and therefore, the influence of the error resulting from the settlement of the output of the DA converter is small. Further, in the sequential comparison-type analog-to-digital ADC in the first embodiment, bits lower than a predetermined bit (here, bit 8) are determined based on the comparison result of one comparator, and therefore, it is possible to decide an AD-converted value with high precision without being affected by the relative offset among the plurality of comparators.

Figure 8:
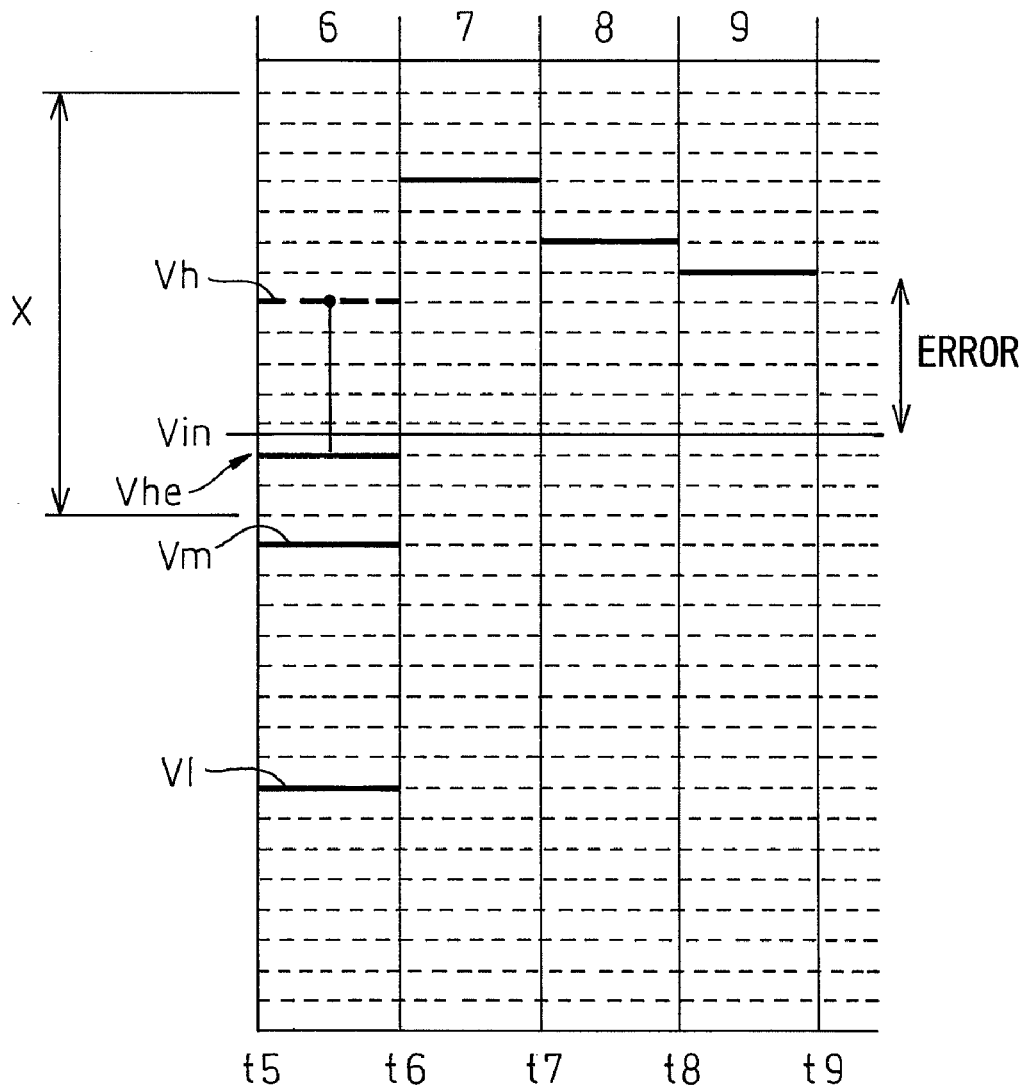
FIG. 8 is a diagram explaining the occurrence of an error when processing that utilizes comparison results of three comparators is switched to processing that utilizes a comparison result of one comparator.

However, the values of higher bits 1 to 7 decided before the switching are corrected by the comparison results of the three comparators 12H, 12M, and 12L, and therefore, the linearity before and after the switching is not guaranteed. FIG. 8 is a diagram for explaining the occurrence of an error when processing that utilizes the comparison results of the three comparators is switched to processing that utilizes the comparison result of one comparator.

As shown in FIG. 8, in step 6, it is assumed that the input signal Vin is between Vm and the correct reference analog signal Vm. However, it is also assumed that Vh substantially becomes Vhe due to an offset etc. In this case, Vin is higher than Vh and a correction is made on the assumption that the comparison result in step 5 is erroneous and Vm in step 7 is set to a level 4LSB higher than the correct reference analog signal Vh. In other words, in step 7, Vm is set to a level 8LSB higher than the level to which Vm should originally be set. In this case, as shown in FIG. 8, even if Vm is changed in steps 7 to 9, it is not possible to make Vm converge to Vin and a conversion error occurs. In a second embodiment to be explained next, the linearity before and after switching is guaranteed more precisely when the use of three comparators is switched to the use of one comparator.

Figure 9:
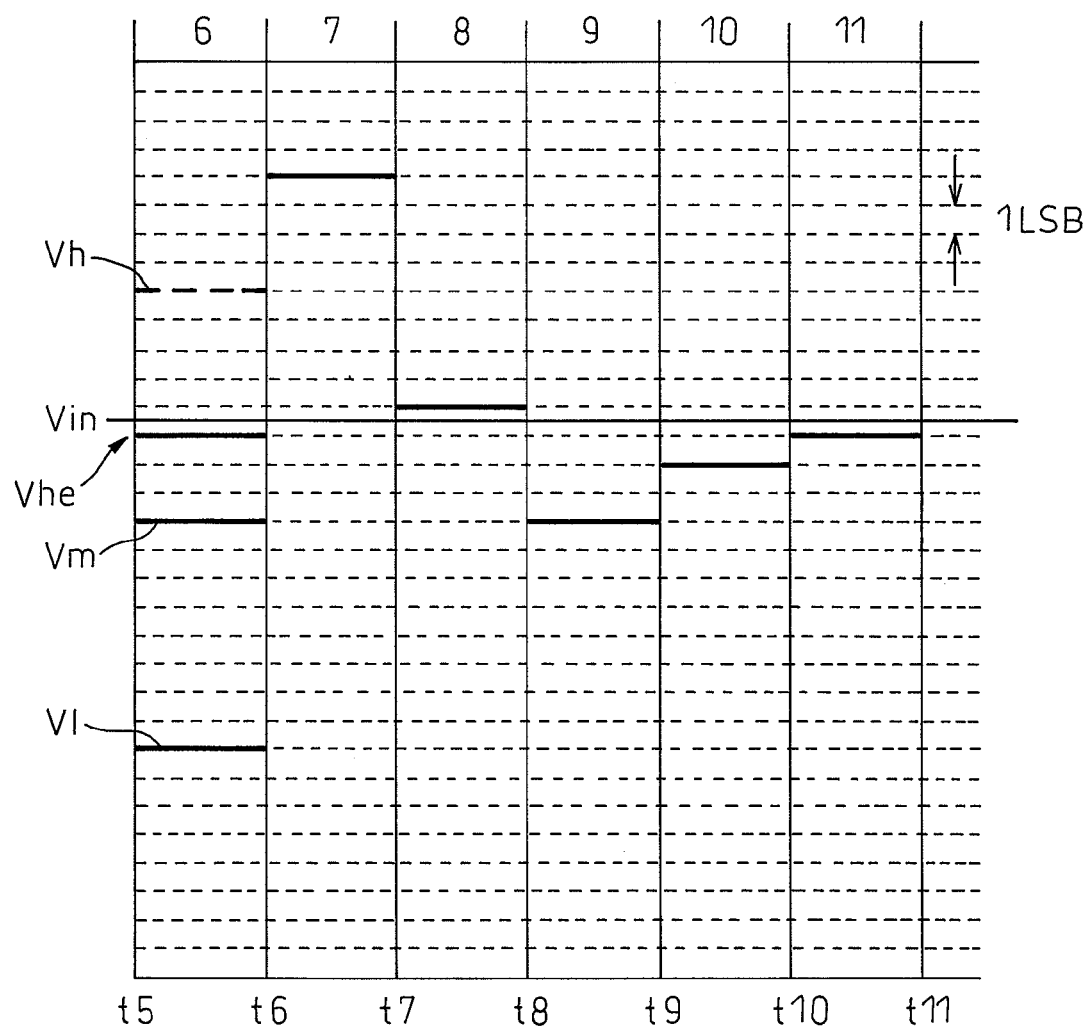
FIG. 9 is a diagram explaining an operation example in a sequential comparison-type ADC in a second embodiment of the present invention.

FIG. 9 is a diagram explaining an operation example in a sequential comparison-type analog-to-digital converter (ADC) in the second embodiment of the present invention. The sequential comparison-type ADC in the second embodiment comprises the same configuration as that of the sequential comparison-type ADC shown in FIG. 3 but differs only in the processing operation in the sequential comparison control circuit 13A.

The sequential comparison-type ADC in the second embodiment is also a 10-bit ADC. The processing steps of the sequential comparison-type ADC in the second embodiment are divided into steps 1 to 6 in the first half and steps 7 to 11 in the second half and a binary conversion algorithm is applied to each step. In steps 1 to 5, higher bits 1 to 6 are decided while being corrected based on the comparison results between Vin and the reference analog signals Vh, Vm, and Vl by the three comparators 12H, 12M, and 12L. In step 6, bit 7 is decided temporarily while being corrected based on the comparison results between Vin and the reference analog signals Vh, Vm, and Vl by the three comparators 12H, 12M, and 12L.

In step 7, Vm is decided based on the comparison results of the three comparators 12H, 12M, and 12L in step 6. In step 7 and subsequent steps, only a comparison by the comparator 12M is made, and therefore, Vh and Vl are not calculated. The comparator 12M compares Vin with the reference analog signal Vm.

Further, in step 8, Vm is decided based on the comparison result in step 7. Vm in step 8 is set 8LSB lower than Vm in step 7 when Vm is determined to be larger than Vin in step 7 and is set 8LSB higher than Vm in step 7 when Vm is determined to be smaller than Vin in step 7. As shown in FIG. 7, in the first embodiment, the difference between Vm in step 8 and Vm in step 7 is 2LSB, however, in the second embodiment, the difference between Vm in step 8 and Vm in step 7 is 8LSB.

Subsequently, in steps 9 to 11, while changing (increasing or decreasing) Vm by 4LSB, 2LSB, and 1LSB, comparisons are made by the comparator 12M and bits 8 to 10 are decided. At this time, there may be a case where bit 7 decided temporarily in step 6 is changed.

As described above, in the second embodiment, all the bits are decided in 10 steps, resulting in an increase in the number of steps by two compared to that in the first embodiment.

In the operation example in the second embodiment shown in FIG. 9, when Vin is determined to be between Vh and Vm or between Vm and Vl in step 6, it is obvious that Vm converges to Vin within 1LSB by step 11. When Vin is determined to be higher than Vh in step 6, Vm converges to Vin within 1LSB by step 11 as shown in FIG. 9. Further, when Vin in determined to be lower than Vl in step 6, it is easy to understand that Vm converges to Vin within 1LSB by step 11. As described above, even if Vh or Vl in step 6 has an offset, Vm is set erroneously by the correction in step 7, and a problem of the linearity of Vm arises, it is made possible to cause Vm to converge to Vin, and therefore, no conversion error will occur.

The bit weight by which Vm is changed for each step becomes smaller gradually as steps proceed; however, in the second embodiment, after the processing that utilizes the comparison results of a plurality of comparators is switched to the processing that utilizes the comparison result of one comparator, the bit weight, by which one reference analog signal used for comparison is changed, is increased temporarily. It is desirable to appropriately decide how much the bit weight is increased in view of the offset among a plurality of comparators etc. For example, in the example in FIG. 9, Vm in step is changed to Vm in step 8 by the weight of bit 7, that is, 8LSB, however, it may also be possible to change by the weight of bit 6, i.e., 16LSB. In this case, it is necessary to increase the number of steps by one in order to cause Vm to converge to Vin.

As described above, in the second embodiment, in order to guarantee the linearity at the time of switching, the number of steps is increased. Consequently, in the second embodiment, it is desirable to set n>k−m where the number of bits of the analog-to-digital converter is k, the number of higher bits down to the predetermined bit to be decided based on the comparison results of a plurality of comparators is m, and the number of steps for deciding bit values based on the comparison result of one of the plurality of comparators is n.

In the first and second embodiments, when the processing that utilizes the comparison results of a plurality of comparators is switched to the processing that utilizes the comparison result of one comparator, it is assumed that the change in amplitude of the reference analog signal output from the DA converter 14A has decreased sufficiently and the influence of the error resulting from the settlement of the output of the DA converter is small. However, if the processing is switched to that which utilizes the comparison result of one comparator before the influence of the error resulting from the settlement of the output of the DA converter becomes sufficiently small, a determination error may occur after the switching, and in this case, there is a possibility that Vm may not converge to Vin. A third embodiment to be explained next is an example in which Vm can be caused to converge to Vin even if an error resulting from the settlement of the output of the DA converter occurs to a certain extent at the time of switching and after the switching.

First, a processing algorithm in a sequential comparison-type analog-to-digital converter (ADC) in the third embodiment of the present invention is explained.

In the sequential comparison-type ADC in the third embodiment, after the processing that utilizes the comparison results of the three comparators is switched to the processing that utilizes the comparison result of one comparator, the weight of the bit by which Vm is changed is increased in view of the offset among the comparators and at the same time, the processing that utilizes the comparison result of one comparator utilizes the non-binary algorithm. The non-binary algorithm is described in "SAR ADC Algorithms with Redundancy" by Tomohiko OGAWA, Haruo KOBAYASHI, Yosuke TAKAHASHI, and Masao HOTTA, THE INSTITUTE OF ELECTRONICS, INFORMATION AND COMMUNICATION ENGINEERS, Circuit and System Research Group, Tokyo (October 2007).

The sequential comparison-type ADC in the third embodiment is also a 10-bit ADC. The processing steps of the sequential comparison-type ADC in the third embodiment include 13 steps in total, divided into steps 1 to 6 in the first half and steps 7 to 13 in the second half.

In step 1, a multibit digital signal whose $D_1=1$, $D_2$ to $D_{10}=0$ is supplied to the DA converter. This multibit digital signal corresponds to the reference analog signal Vm and Vm=VFS/2 is generated. Vh is the voltage value of 3VFS/4, which is Vm increased by the amount of weight of bit 2 $Vr(1)$=VFS/4 and Vl is the voltage value of VFS/4, which is Vm decreased by the amount of weight of bit 2 $Vr(1)$=VFS/4, and Vh and Vl are generated along with Vm. As described above, VFS is a full-scale voltage.

The input signal Vin is compared with Vh, Vm, and Vl by three comparators. The comparison result between Vin and Vh is Ch, the comparison result between Vin and Vm is Cm, and the comparison result between Vin and Vl is In step 1, the value of MSB (bit 1) and bit 2 are decided at the same time from Ch, Cm, and Cl.

That is, it is assumed that:
 when $0 \leq Vin \leq Vl$ (Ch=0, Cm=0, Cl=0), bits 1, 2=00;
 when $Vl \leq Vin \leq Vm$ (Ch=0, Cm=0, Cl=1), bits 1, 2=01;
 when $Vm \leq Vin \leq Vh$ (Ch=0, Cm=1, Cl=1), bits 1, 2=10; and
 when $Vh \leq Vin \leq VFS$ (Ch=0, Cm=0, Cl=1), bits 1, 2=11

Next, bits 3 to 7 are decided in steps 2 to 6.

In steps 2 to 6, in step i (i=2 to 6) for deciding bit i+1, the reference analog signal Vm(i) is decided as follows based on the comparison result in the previous step:
 when $0 \leq Vin \leq Vl$ (Ch=0, Cm=0, Cl=0), $$Vm(i)=Vl(i-1)-Vr(i-1)=Vm(i-1)-Vr(i-1)-Vr(i+1);$$

when $Vl \leq Vin \leq Vm$ (Ch=0, Cm=0, Cl=1), $$Vm(i)=Vm(i-1)-Vr(i+1);$$

when $Vm \leq Vin \leq Vh$ (Ch=0, Cm=1, Cl=1), $$Vm(i)=Vm(i-1)+Vr(i+1); \text{ and}$$

when $Vh \leq Vin \leq VFS$ (Ch=0, Cm=0, Cl=1), $$Vm(i)=Vh(i-1)+Vr(i+1)=Vm(i-1)+Vr(i-1)+Vr(i+1).$$

Here, Vr(i) denotes the weight of bit i and $Vr(i+1)=Vr(i)/2$. For example, the weights of bits 1 to 7 are VFS/2, VFS/4, VFS/8, VFS/16, VFS/32, VFS/64, and VFS/128. In step 2, i=2 and $Vr(i+1)$=VFS/8. In step 2, Vh, Vm, and Vl are decided based on the comparison result in step 1 and in steps 3 to 6, Vh, Vm, and Vl are decided based on the comparison results in the previous steps 2 to 5. For example, in step 1, when $Vm \leq Vin \leq Vh$ (Ch=0, Cm=1, Cl=1), in step 2, Vm=Vm(i−1)+Vr(i+1)=VFS/2+VFS/8=5VFS/8. Further, Vh(i) and Vl(i) are set as follows.

$$Vh(i)=Vm(i)+Vr(i+1),$$

$$Vl(i)=Vm(i)-Vr(i+1)$$

In steps 7 to 13 in the second half, the determination is made using only Cm, which is the result of the comparison with Vm. In this case, Vm is decided as follows.

First, in step 7, based on the comparison results of the three comparators in step 6, Vm is set as in steps 2 to 6 and a comparison is made.

Steps 8 to 13 are denoted by step j (j=1 to 6). It is assumed that a value to be added to or subtracted from Vm(j−1) in step j−1 is p(j). The value of p(j) is determined in advance and stored in, for example, a memory in accordance with j (j=1 to 6) and it is possible to read and use p(j) by inputting j. It is also possible to use a logic circuit that generates and outputs p(j) according to j. In step j−1, when Vin is determined to be larger than Vm, p(j) is added to Vm(j−1) in step j−1 and when Vin is determined to be smaller than Vm, p(j) is subtracted from Vm(j−1) in step j−1.

Figure 10:
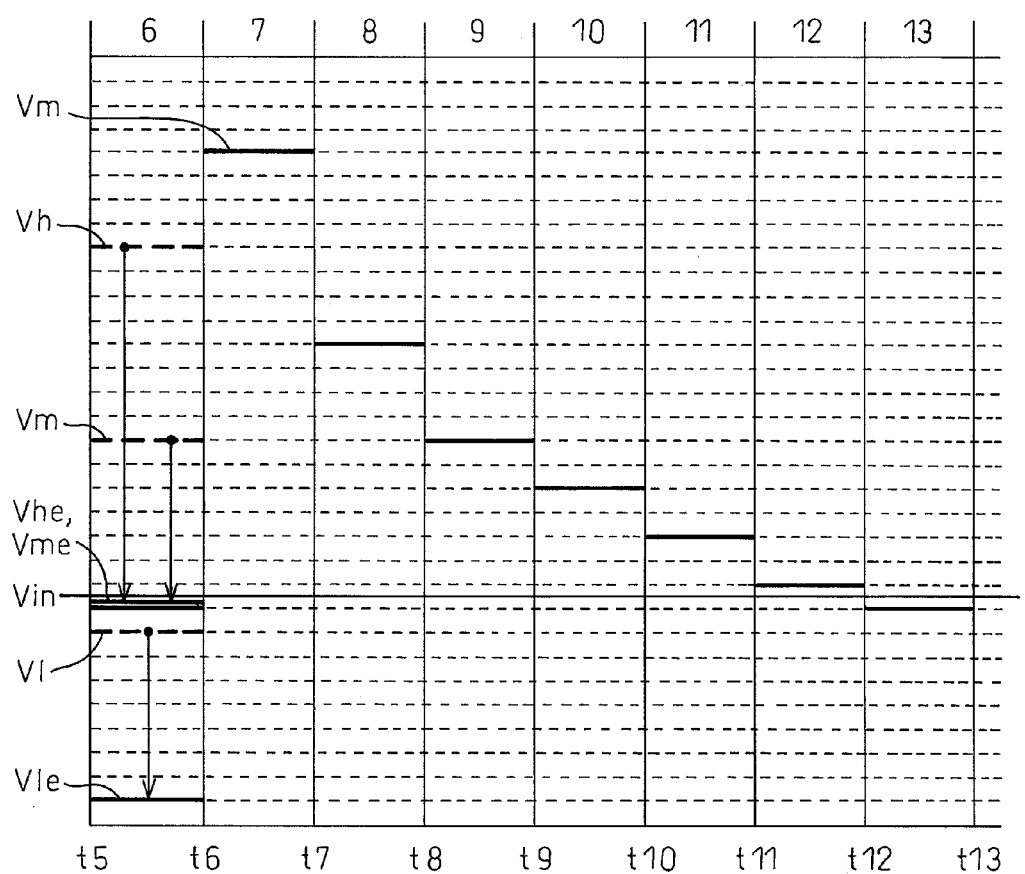
FIG. 10 is a diagram showing a change example of Vm in steps 6 to 13 in a sequential comparison-type ADC in a third embodiment of the present invention.

FIG. 10 is a diagram showing an example of the change in Vm in steps 6 to 13 in the sequential comparison-type ADC in the third embodiment.

In the example in FIG. 10, it is assumed that the input signal Vin is between Vm and the correct reference analog signal Vh in step 6. However, it is also assumed that Vh, Vm, and Vl substantially become Vhe, Vme, and Vle due to the offset etc. and Vhe=Vme and Vin is higher than Vhe, Vme, and Vle. In this case, Vin is higher than Vh and a correction is made on the assumption that the comparison result in step 5 is erroneous and Vm in step 7 is set to a level 4LSB higher than the correct reference analog signal Vh. However, the correct Vm in step 7 should be set 4LSB lower than Vm in step 6. In other words, in step 7, Vm is set to a level 16LSB higher than the level to which Vm should be set originally. Consequently, by the comparison in step 7, Vm is determined to be higher than Vin.

Vm in steps 8 to 13 is set by the non-binary conversion algorithm. In the example in FIG. 10, p(j) for j=1 to 6 is 8, 4, 2, 2, 2, and 1. Consequently, in step 8, Vm is 8LSB lower than Vm in step 7 and subsequently, Vm decreases until step 13 is reached by 4, 2, 2, 2, and 1LSB in order and in step 13, Vm is 19LSB lower than Vm in step 7 and converges to Vin within 1LSB.

Redundancy in steps 7, 8 to 13 is examined. Vm(7) in step 7 is decided based on the comparison results of the three comparators in step 6. In steps 8 to 13 (step j (j=1 to 6)), the bit weight p(j) is added to or subtracted from Vm'(j−1) in step j−1 according to the comparison result in step j−1. Let the comparison result in step j−1 be d(j−1), then, in the case of addition, the result d(j−1)=1 and in the case of subtraction, the result d(j−1)=−1. Vm'(j) in step j is represented by the following mathematical expression (1).

$$V'_m(j) = \sum_{r=1}^{j} d(r-1)p(r) \quad \ldots \ldots \ldots \quad (j = 1, 2, \ldots M) \tag{1}$$

Redundancy q(j) in step j is considered. Redundancy indicates how close to the range of the erroneous (opposite) comparison result it is possible to become in subsequent steps when addition/subtraction of p(j+1) is made erroneously in step j+1 based on the comparison result in step j. Within this range, it is possible to obtain the correct conversion result even if an error is made in step j. The redundancy q(i) is defined by the following mathematical expression (2).

$$q(j) = -p(j+1) + 1 + \sum_{r=j+2}^{M} p(j) \tag{2}$$

On the other hand, when N bits are subjected to AD conversion in M steps, a relationship with the value q(j) (j=1, 2, ..., M) to be added/subtracted in step j is represented by the following mathematical expression (3).

$$2^M - 2^N = \left(\sum_{r=1}^{M-1} 2^r q(r)\right) + 2 \cdot (\text{over range amount}) \tag{3}$$

Here, the number that can be taken in order to make N bits ($2^N$) converge in M steps exceeds the total values to be added/ subtracted and an over range amount indicates the amount of the residue (corresponding to those beyond the upper and lower limits in the case of the AD conversion of N bits).

SAR ADC Algorithms with Redundancy by Tomohiko OGAWA, Haruo KOBAYASHI, Yosuke TAKAHASHI, and Masao HOTTA, THE INSTITUTE OF ELECTRONICS, INFORMATION AND COMMUNICATION ENGINEERS, Circuit and System Research Group, Tokyo (October 2007) has reported that the following mathematical expression (4) can be obtained from those described above.

$$p(j+1) = -q(j) + 2^{M-j-1} - \sum_{r=j+1}^{M-1} 2^{r-j-1} q(r) \tag{4}$$

From those explained above, it is possible to calculate p(j) that realizes the sequential AD conversion of N bits in M steps using mathematical expression (4) by designing the redundancy q(j) and the over range amount of each stage so as to satisfy mathematical expression (3).

The example shown in FIG. 10 shows a case where the design is made so that 19LSB is converted in seven steps. For the redundancy in each step, it is possible to decide p(j) to be added/subtracted in such a manner that 8LSB is substantially halved in six steps and in FIG. 10, it is decided as 8, 4, 2, 2, 2, and 1LSB. These values are merely an example, and they may be appropriately decided according to the design.

Figure 11:
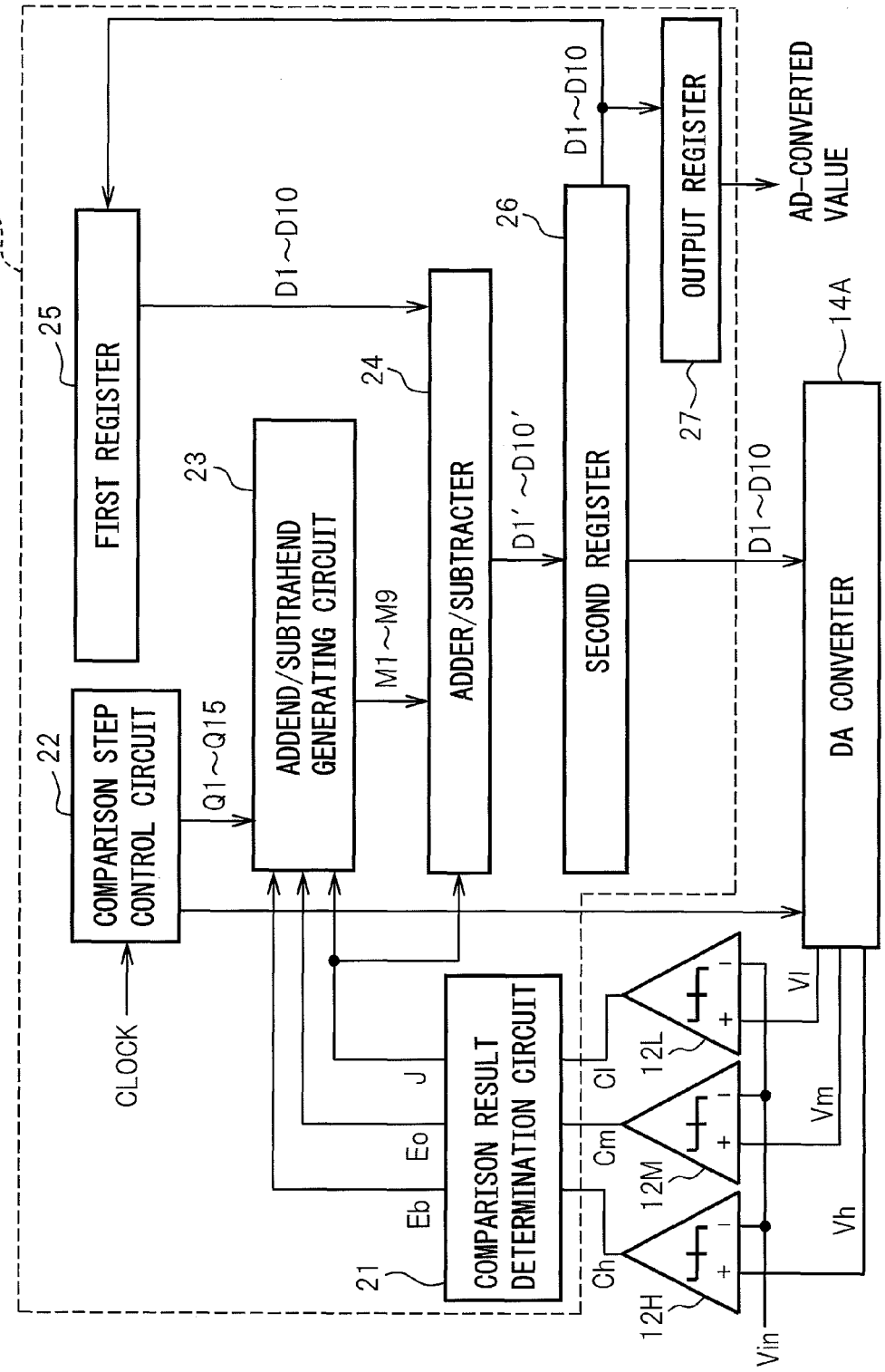
FIG. 11 is a diagram showing a configuration of the sequential comparison-type ADC in the third embodiment.

FIG. 11 is a diagram showing a configuration of the sequential comparison-type analog-to-digital converter (ADC) in the third embodiment of the present invention that realizes the conversion algorithm shown in FIG. 10.

As shown in FIG. 11, the sequential comparison-type ADC in the third embodiment comprises the three comparators 12H, 12M, 12L, a comparison result determination circuit 21, a comparison step control circuit 22, an addend/subtrahend generating circuit 23, an adder/subtracter 24, a first register 25, a second register 26, an output register 27, and a DA converter (digital-to-analog converter) 14A. The comparison result determination circuit 21, the comparison step control circuit 22, the addend/subtrahend generating circuit 23, the adder/subtracter 24, the first register 25, the second register 26, and the output register 27 configure a sequential comparison control circuit 13B.

The input analog signal SA is held temporarily by a sample-holding circuit, not shown schematically, and input to the three comparators 12H, 12M, 12L as the input signal Vin. The DA converter 14A outputs the three different reference analog signals Vh, Vm, Vl according to the multibit digital signals D1 to D10 from the sequential comparison control circuit 13B as in FIG. 3. The three comparators 12H, 12M, 12L compare the input signal Vin with the reference analog signals Vh, Vm, Vl, respectively and output the comparison results Ch, Cm, Cl. The comparison results Ch, Cm, Cl are input to the comparison result determination circuit 21. The comparison result determination circuit 21 outputs a comparison result J between the input signal Vin and the reference analog signals Vh, Vm, Vl based on the comparison results Ch, Cm, Cl and at the same time, outputs a signal Eo indicative of overflow or underflow and a signal Eb indicative of the presence/absence of an inconsistent result. The comparison step control circuit 22 controls each comparison step. The addend/subtrahend generating circuit 23 generates a value to be added to or subtracted from the comparison level in the previous step for each comparison step. Addition or subtraction is controlled according to the result output from the comparison result determination circuit 21 and the adder/subtracter 24 adds or subtracts the value output from the addend/subtrahend generating circuit 23 to or from the comparison level in the previous step for each comparison step. The second register 26 temporarily holds results D1' to D10' of the addition or subtraction of the output by the adder/subtracter 24 and outputs them to the DA converter 14A, the first register 25, and the output register 27 as the multibit digital signals D1 to D10. The first register 25 temporarily holds the multibit digital signals D1 to D10 and outputs them to the adder/subtracter 22 as data in the immediately previous step. The output register 27 holds the multibit digital signal D1 to D10 output from the second register 26 when they are fixed and outputs them as AD-converted values.

Figure 12:
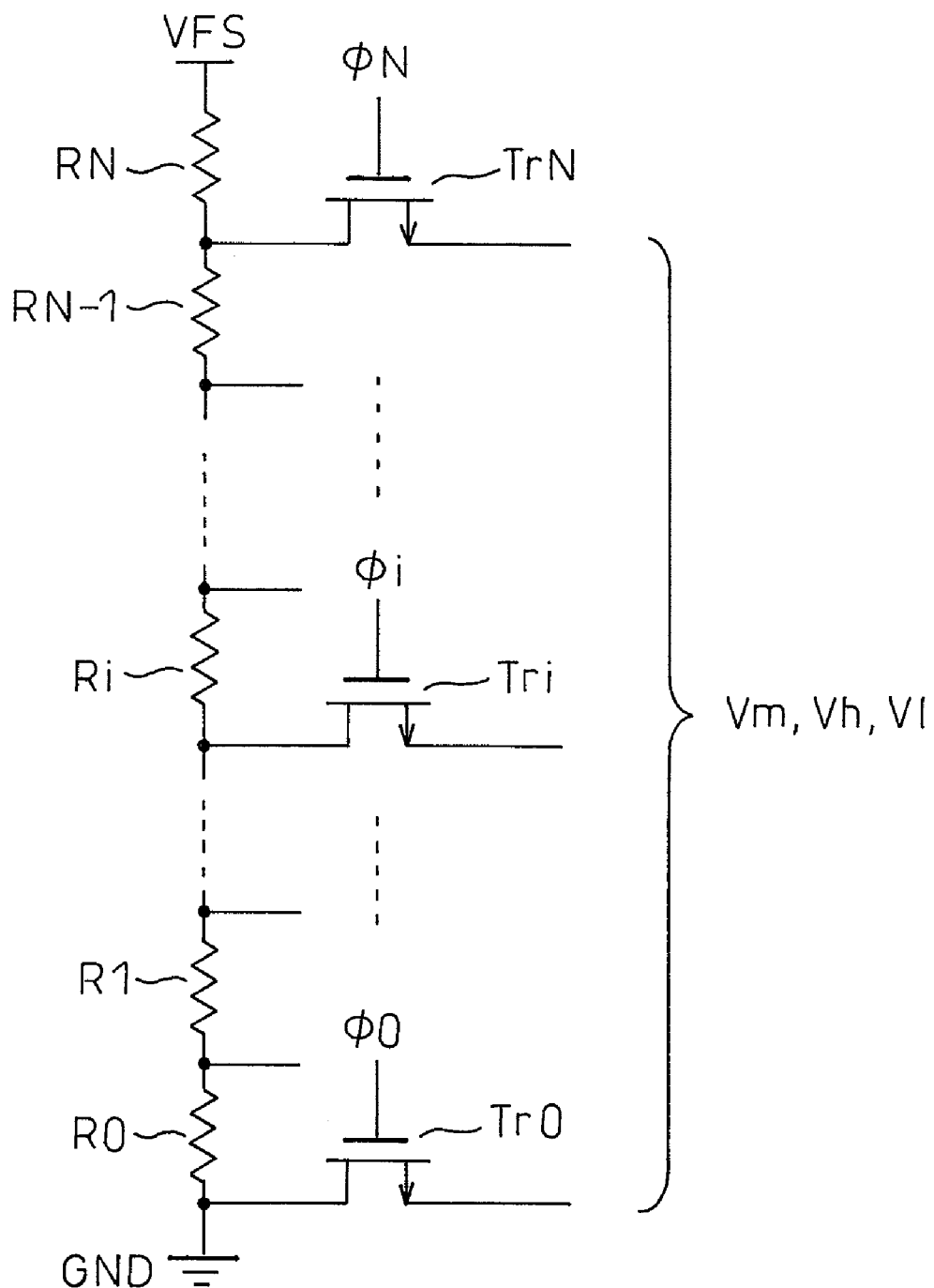
FIG. 12 is a diagram showing part of a configuration of a DA converter of the sequential comparison-type ADC in the third embodiment.

FIG. 12 is a diagram showing part of the configuration of the DA converter 14A. The DA converter 14A comprises a ladder resistor, in which resistors R0, R1, . . . , Ri, . . . , RN−1, RN are connected in series between the terminal of the full-scale voltage VFS and GND, and switches Tr0, Tri, . . . , TrN to extract a voltage signal of the connection node of the ladder resistor. The other ends (output ends) of the switches Tr0, Tri, . . . , TrN are connected commonly. In the DA converter 14A, it is possible to extract a voltage signal of one connection node of the ladder resistor as Vm by decoding the multibit digital signals D1 to D10 corresponding to Vm using a decoder, not shown schematically, and selecting one of the switches Tr0, Tri, . . . , TrN. Three sets of the ladder resistor, the switch string, and the decoder are required to generate and output the reference analog signals Vh and Vl, however, it is desirable to share the ladder resistor. Although not shown schematically, the DA converter 14A comprises a digital operation circuit that generates data indicative differences between Vh and Vm and between Vm and Vl, which correspond to signals indicative of steps 1 to 6 output from the comparison control circuit 22 and adds or subtracts it to or from the multibit digital signals D1 to D10 and the DA converter 14A applies the output to a decoder for Vh and Vl.

It is also possible to provide a DA converter of current output type that generates a DAC output corresponding to the complete differential Vm and a sub DA converter that generates a sub DAC output in the form of a complete differential current output having a weight of $2^{-n}$ and to cause the DA converter to generate a DAC output according to the multibit signals D1 to D10 and the sub DA converter to generate a sub DAC output according to signals Q1 to Q15 indicative of steps, and to generate Vh and Vl by adding the sub DAC output or the sub DAC output negatively converted to the DAC output. If this is done, it is possible to generate Vh and Vl only by addition processing of an electric current.

When the comparator described in U.S. Pat. No. 7,561,094 B2 is used as the comparators 12H, 12M, 12L, it is possible to set up a configuration in which a voltage to be added or subtracted is applied to its + input terminal and − input terminal and in this case, The DA converter 14A is required only to generate a voltage to be added to or subtracted from Vm.

Figures 13A, 13B:
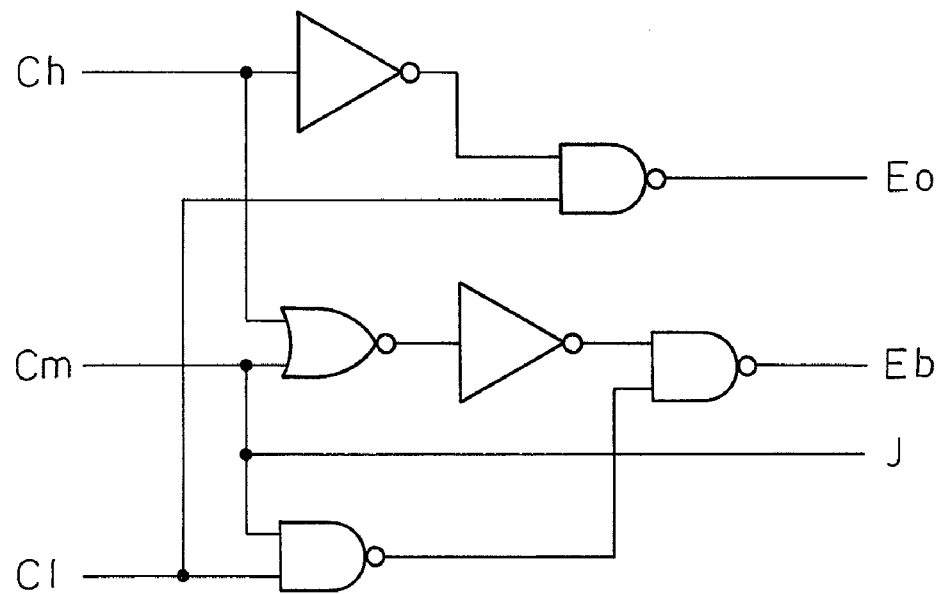
FIG. 13A is a diagram showing a configuration of a comparison result determination circuit of the sequential comparison-type ADC in the third embodiment.
FIG. 13B is a diagram showing a truth table showing the operation of the comparison result determination circuit of the sequential comparison-type ADC in the third embodiment.

FIG. 13A is a diagram showing the configuration of the comparison result determination circuit 21 and FIG. 13B is a diagram showing a truth table indicating the operation of the comparison result determination circuit 21.

As shown in FIG. 13A, the comparison result determination circuit 21 includes a logic circuit and outputs the signals J, Eo, and Eb as shown in FIG. 13B according to the comparison results Ch, Cm, Cl to be input. The signal J is a comparison result between the input signal Vin and the reference analog signal Vm. The signal Eo indicates that overflow or underflow occurs when it is "1" and indicates that the comparison results Ch, Cm, Cl are inconsistent results when "0". When Eb is "0", it is determined that anomaly occurs and the AD conversion processing is terminated or processing, such as that the processing in that step is ignored, is performed and J and Eo are ignored.

Figure 14A:
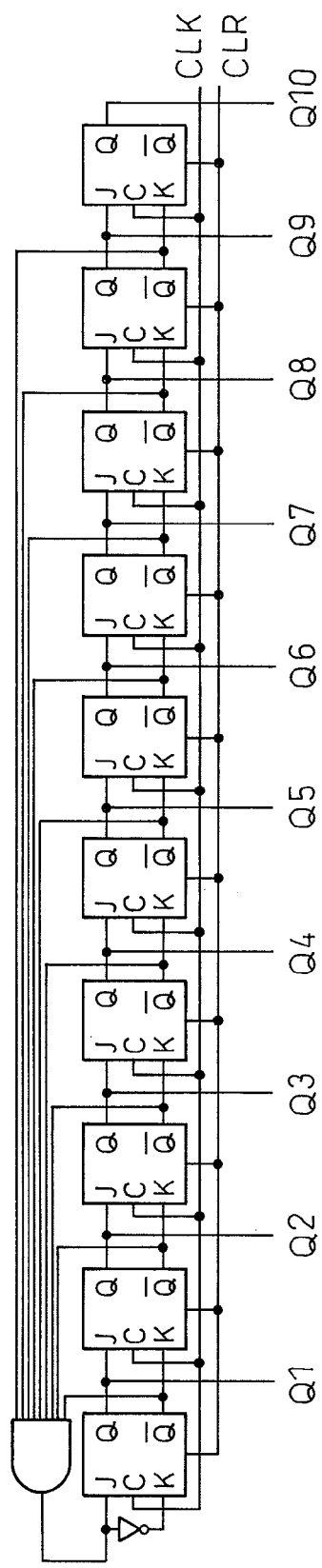
FIG. 14A is a diagram showing a configuration of an example of a ring counter configuring a comparison step control circuit of the sequential comparison-type ADC in the third embodiment.
Figure 14B:
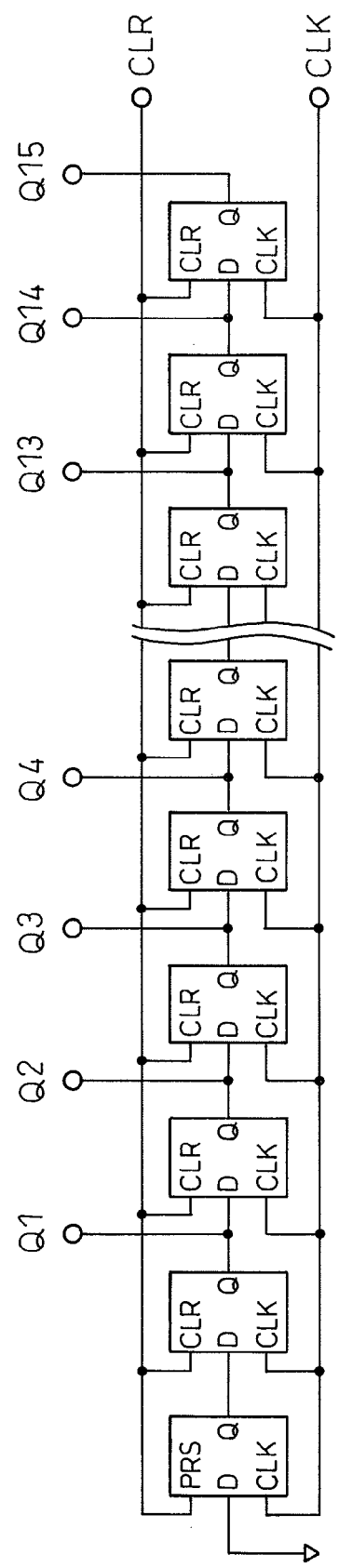
FIG. 14B is a diagram showing a configuration of another example of the ring counter configuring the comparison step control circuit of the sequential comparison-type ADC in the third embodiment.

FIG. 14A and FIG. 14B are diagrams showing a configuration example of a ring counter configuring the comparison step control circuit 22. The ring counter is a widely-known circuit, in which one of outputs changes to "1" and the rest to "0" and the position of the output that changes to "1" moves one by one according to a clock CLK. FIG. 14A shows a 10-bit ring counter used generally, in which all outputs are initialized to "0" by a clear CLR, Q1 changes to "1" according to CLK, and subsequently the position of "1" moves according to CLK, and when Q10 changes from "1" to "0", Q1 changes to "1" again by the feedback from the AND gate and this operation is repeated.

In the third embodiment, it is also possible to use the ring counter shown in FIG. 14A; however, in the third embodiment, the operation does not need to be repeated, and therefore, the ring counter shown in FIG. 14B is used. FIG. 14B shows an example of a 15-bit ring counter. The number of steps in the third embodiment is 13 and Q1 to Q13 are used as clocks for the comparison operation and Q14 and Q15 are used as end pulses notifying the completion of conversion or as clocks to reserve the AD-converted value in the output register 27.

Figure 15:
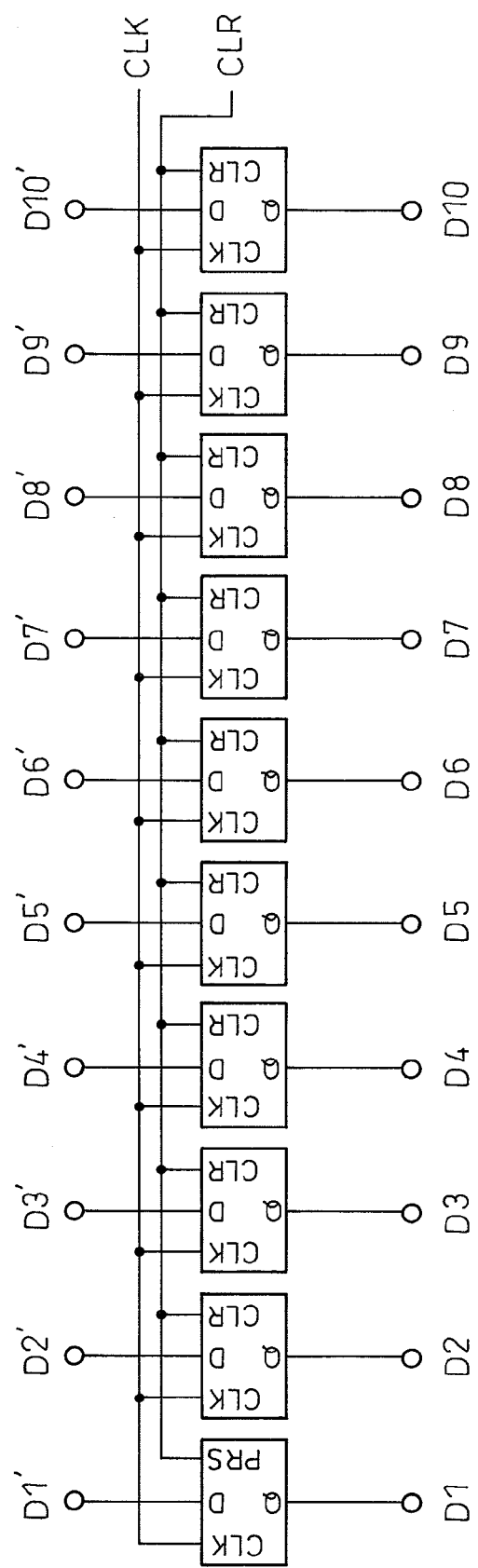
FIG. 15 is a diagram showing a configuration of a second register of the sequential comparison-type ADC in the third embodiment.

FIG. 15 shows the configuration of the second register 26 and the first resister 25 and the output register 27 also have the same configuration. The circuit in FIG. 15 is widely known, and therefore, its explanation is omitted.

Figure 16:
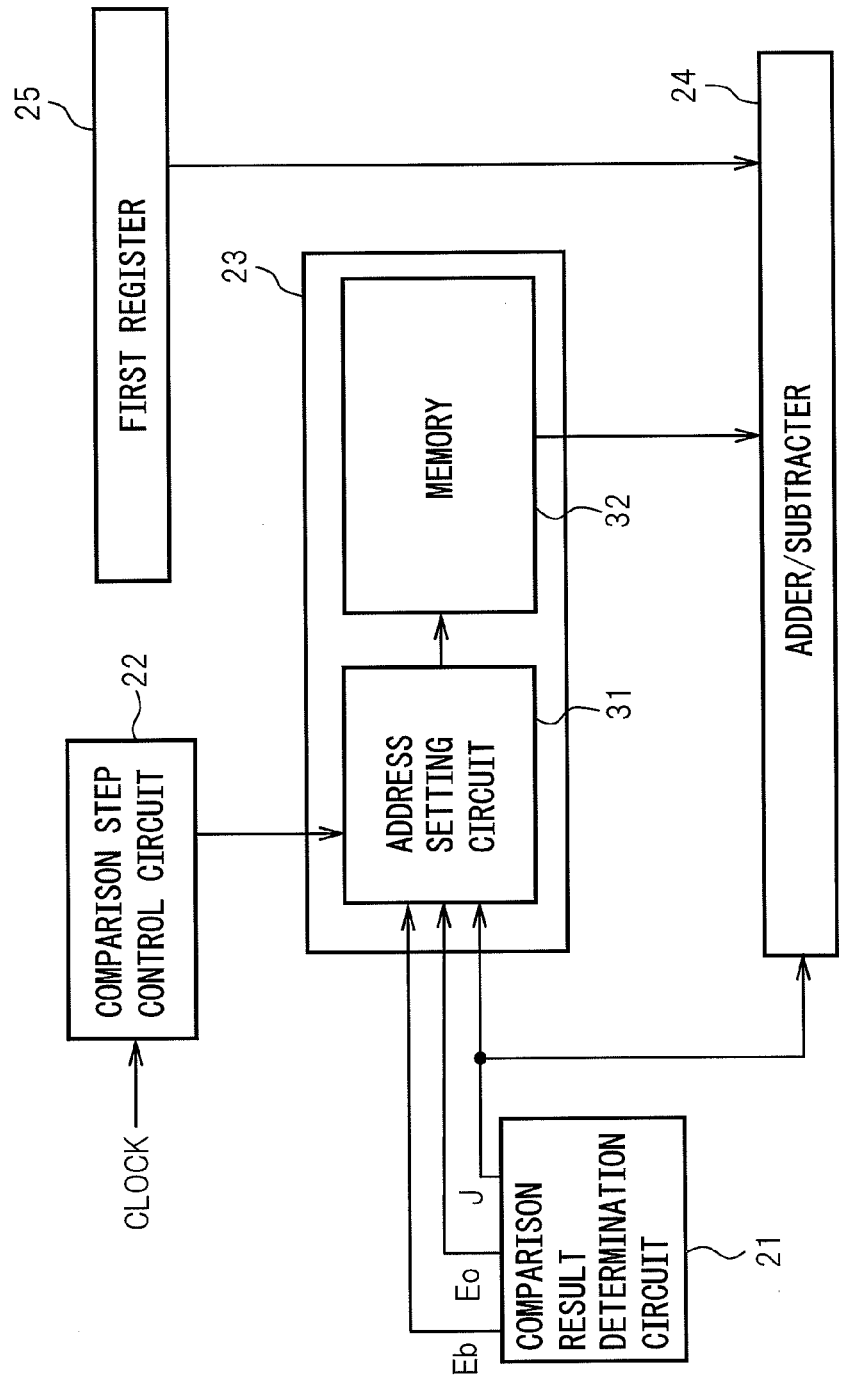
FIG. 16 is a diagram showing a configuration of an addend/subtrahend generating circuit of the sequential comparison-type ADC in the third embodiment, and a configuration of the periphery thereof.

FIG. 16 is a diagram showing the configuration of the addend/subtrahend generating circuit 23 and the configuration of the peripheral part of the addend/subtrahend generating circuit 23. As shown in FIG. 16, the addend/subtrahend generating circuit 23 comprises an address setting circuit 31 and a memory 32.

The addend/subtrahend generating circuit 23 decides the values of bits 1 to 7 while correcting them by the binary conversion algorithm using the three comparators 12H, 12M, 12L in steps 1 to 6 in the first half described above (however, there may be a case where the bit(s) decided in the steps in the first half is modified in the steps in the second half), and generates values M1 to M9 to be added or subtracted when performing processing to decide values of bits 8 to 10 by the non-binary algorithm using one comparator 12M in the steps in the second half.

In steps 1 to 6 in the first half, a correction is made according to the outputs J, Eo, and Eb of the comparison result determination circuit 21, and therefore, in the memory 32, the values M1 to M9 to be added or subtracted in the steps in the first half are stored with the signals Q1 to Q15 indicative of steps 1 to 6 from the comparison result control circuit 22 and J, Eo, and Eb as addresses. For example, when Q1="1" (other Qs are "0", not shown hereinafter), it means step 1 and therefore M1="1", M2 to M9="0" are stored. This corresponds to VFS/2. When Q2="1", it means step 2 and therefore M3="1" and M1 to M2, M4 to M9="0" are stored for Q2="1", Eo="0", and Eb="1" (this corresponds to VFS/8) and M2 to M3="1", M1, M4 to M9="0" are stored for Q2="1" and Eo="0" (this corresponds to 3VFS/8).

In steps 7 to 13 in the second half, regardless of the output of the comparison result determination circuit 21, the values to be added or subtracted are decided in advance by the non-binary conversion algorithm, and therefore, the values to be added or subtracted decided by the non-binary conversion algorithm are stored for Q7="1" to Q13="1".

In each step, the address setting circuit 31 sets an address according to the signals Q1 to Q15 indicative of the steps from the comparison step control circuit 22 and J, Eo, and Eb, reads a value to be added/subtracted from the memory 32, and outputs it to the adder/subtracter 24.

The memory 32 can be configured by a ROM when a value to be added/subtracted in each step is decided from the design stage or configured by a flash memory when it is necessary to arbitrarily set a value to be added/subtracted after the design, and the value to be added/subtracted later is written to the flash memory. It may also be possible to configure the memory 32 by a RAM and write a value to be added/subtracted to the RAM at the time of activation.

Figure 17:
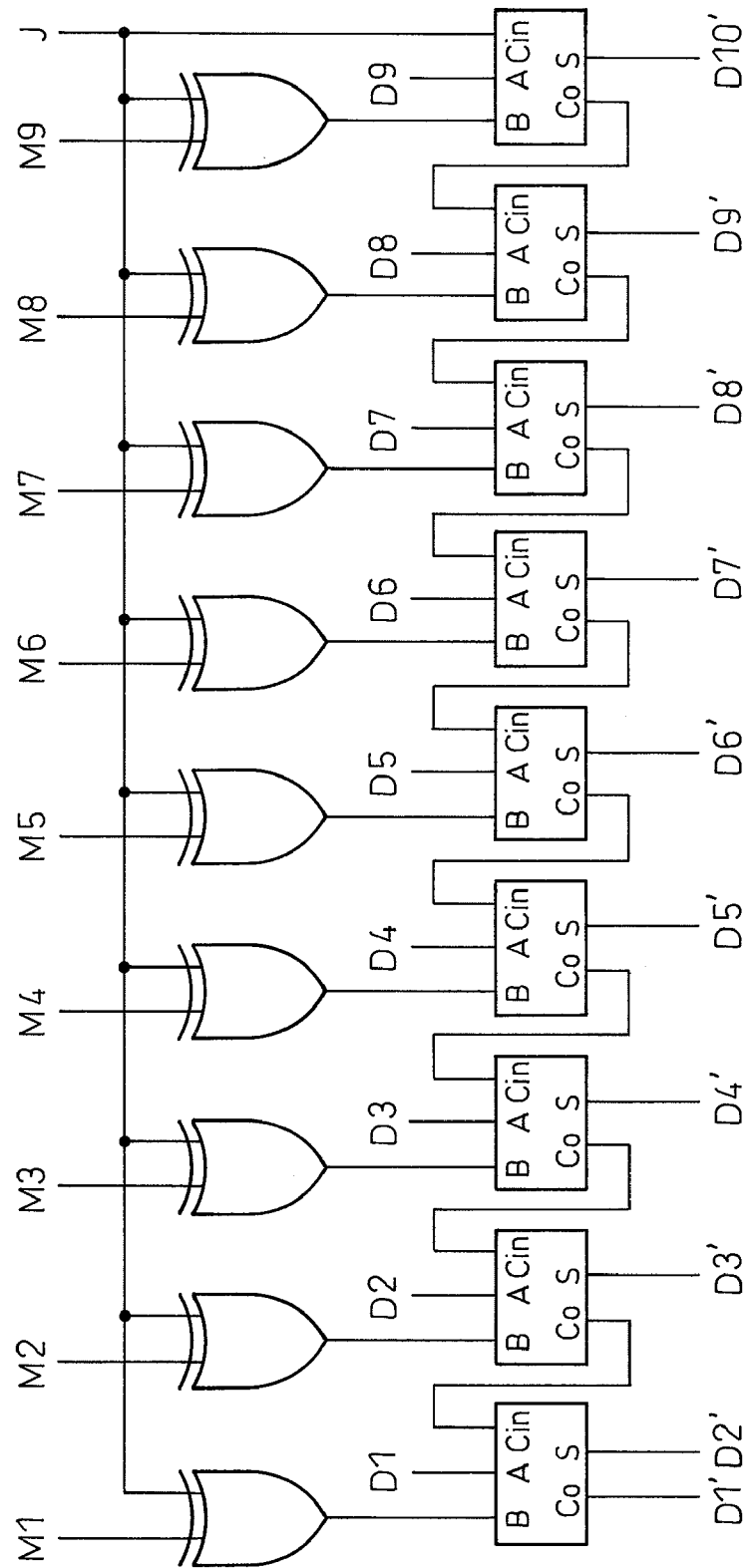
FIG. 17 is a diagram showing a configuration of an adder/subtracter of the sequential comparison-type ADC in the third embodiment.

FIG. 17 is a diagrams showing a configuration of the adder/subtracter 24. The adder/subtracter 24 adds the values M1 to M9 to be added/subtracted from the addend/subtrahend generating circuit 23 to the multibit digital signals D1 to D10 from the first register when J=1, and subtracts the values M1 to M9 to be added/subtracted from the addend/subtrahend generating circuit 23 from the multibit digital signals D1 to D10 from the first register 26 when J=0.

As shown in FIG. 16, in the third embodiment, the addend/subtrahend generating circuit 23 comprises a memory and a value to be added/subtracted in each step is stored in and read from the memory with the signal indicative of the step from the comparison step control circuit 22 and the signal from the comparison result determination circuit 21 as an address. It is also possible to generate a value to be added/subtracted in a logic circuit.

Figure 18:
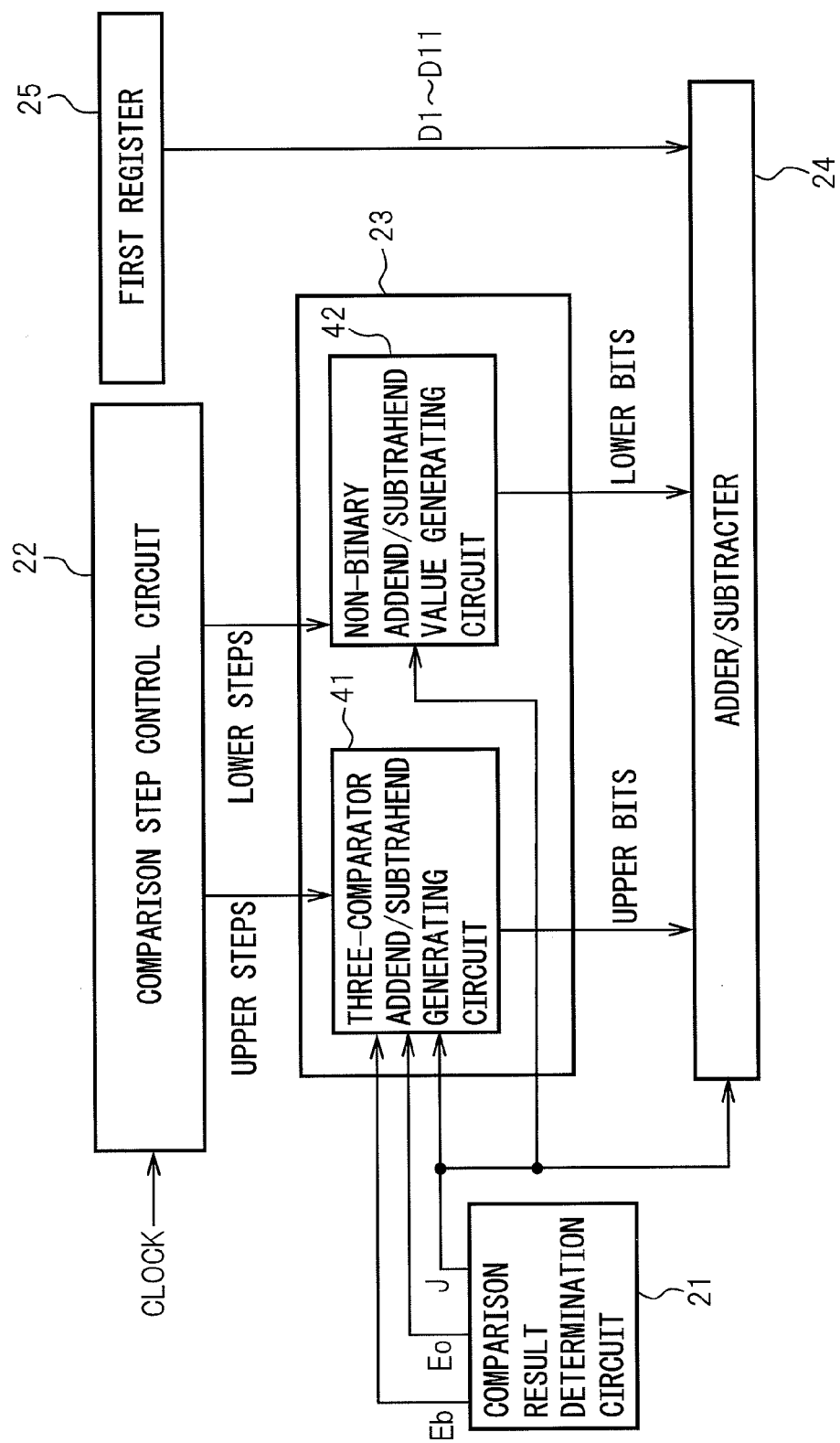
FIG. 18 is a diagram showing a configuration of a modified example in which an addend/subtrahend generating circuit is realized by a logic circuit in the sequential comparison-type ADC in the third embodiment.

FIG. 18 is a diagram showing a configuration of a modified example in which the addend/subtrahend generating circuit 23 is realized by a logic circuit. As shown in FIG. 18, the addend/subtrahend generating circuit 23 comprises a three-comparator addend/subtrahend generating circuit 41 and a non-binary addend/subtrahend generating circuit 42. The three-comparator addend/subtrahend generating circuit 41 generates an addend/subtrahend to be corrected according to the binary conversion algorithm with the signal indicative of the step from the comparison step control circuit 22 and the signals J, Eo, Eb from the comparison result determination circuit 21 as inputs during steps 1 to 6. The non-binary addend/subtrahend generating circuit 42 generates an addend/subtrahend according to the non-binary conversion algorithm with the signal indicative of the step from the comparison step control circuit 22 and the signal J from the comparison result determination circuit 21 as inputs during steps 7 to 13. The comparator addend/subtrahend generating circuit 41 and the non-binary addend/subtrahend generating circuit 42 can be designed easily if described by the RTL language, etc.

In the first to third embodiments explained above, in the steps up to step 6 in the first half, the values of bits are decided while being corrected by utilizing the comparison results of the three comparators, and in the remaining steps, the values of bits are decided while being corrected by utilizing the comparison result of one comparator. From which step the determination is switched to that with one comparator is examined. When the fine CMOS technology is employed and the power source voltage is reduced, the signal amplitude can be thought to be about 1 V as a differential. On the other hand, the cause of the offset of the comparator is a miss match of the threshold voltages of two MOS transistors and its magnitude can be estimated at about a voltage of several millivolts. If the magnitude is assumed to be 8 mV, 8/1,000 of the full-scale voltage (maximum signal amplitude)=$1/128$, corresponding to 7 bits. Consequently, the use of the three comparators for determination will be disadvantageous hereinafter, and therefore, it is desirable to determine a step from which the use of three comparators is switched to the use of one comparator in the vicinity of step 7. In actuality, the signal amplitude, the magnitude of miss match, the degree of redundancy, etc., fluctuate in a certain range due to the design specifications, and therefore, it is reasonable to determine a step for switching between step 6 and step 8 from the viewpoint of the easiness of design and the improvement in conversion speed due to the increase in the redundancy, which is the characteristic of the prevent invention.

It is obvious that there can also be various modified examples in addition to those explained above. For example, the number of comparators used in the steps in the first half is not limited to three as described above and two or four comparators may be used.

The present invention can be applied to any sequential comparison-type AD conversion circuit.

What is claimed is:

1. An analog-to-digital converter comprising:
   a digital-to-analog converter that outputs a plurality of different reference analog signals according to a multibit digital signal;
   a plurality of comparators that compare an input analog signal with the plurality of reference analog signals; and
   a sequential comparison control circuit that changes bit values of the multibit digital signal in order from higher bits so that at least one of the plurality of reference analog signals becomes closer to the input analog signal and decides the bit values of the multibit digital signal in order from higher bits based on the comparison results of the plurality of comparators according to the plurality of changed reference analog signals and at the same time, correcting the decided bit values, wherein
   the sequential comparison control circuit decides the bit values of the multibit digital signal down to a predetermined bit based on the comparison results of the plurality of comparators and at the same time, correcting the bit values, and decides the bits lower than the predetermined bit based on the comparison result of one of the plurality of comparators.

2. The analog-to-digital converter according to claim 1, wherein
   k>n−m holds where the number of bits of the analog-to-digital converter is n, the number of bits down to the predetermined bit to be decided based on the comparison results of the plurality of comparators is m, and the number of steps for deciding the bit values based on the comparison result of one of the plurality of comparators is k.

3. The analog-to-digital converter according to claim 1, wherein
   the sequential comparison control circuit changes the bit values of the multibit digital signal according to the non-binary conversion algorithm when deciding the bits lower than the predetermined bit.

4. The analog-to digital converter according to claim 2, wherein
   the sequential comparison control circuit changes the bit values of the multibit digital signal according to the non-binary conversion algorithm when deciding the bits lower than the predetermined bit.

* * * * *